(12) United States Patent
Rautio

(10) Patent No.: US 7,356,791 B2
(45) Date of Patent: Apr. 8, 2008

(54) METHOD AND APPARATUS FOR RAPID ELECTROMAGNETIC ANALYSIS

(75) Inventor: James C. Rautio, Phoenix, NY (US)

(73) Assignee: Sonnet Software, Inc., North Syracuse, NY (US)

( * ) Notice: Subject to any disclaimer, the term of this patent is extended or adjusted under 35 U.S.C. 154(b) by 352 days.

(21) Appl. No.: 11/171,935

(22) Filed: Jun. 30, 2005

(65) Prior Publication Data

US 2006/0271891 A1 Nov. 30, 2006

Related U.S. Application Data

(60) Provisional application No. 60/685,646, filed on May 27, 2005.

(51) Int. Cl.
*G06F 17/50* (2006.01)

(52) U.S. Cl. .................................. 716/5; 716/4; 716/6

(58) Field of Classification Search .................. 716/4–6
See application file for complete search history.

(56) References Cited

U.S. PATENT DOCUMENTS 6,163,762 A 12/2000 Rautio

OTHER PUBLICATIONS

James C. Rautio and Robert Groves, A Potentially Significant On-Wafer High-Frequency Measurement Calibration Error, IEEE Microwave Magazine, Dec. 2005, 5 pgs.
James C. Rautio, Fellow, IEEE, Deembedding the Effect of a Local Ground Plane in Electromagnetic Analysis, IEEE Transactions on Microwave Theory and Techniques, vol. 53, No. 2, Feb. 2005, 7 pgs.
James C. Rautio, Fellow, IEEE, and Vladimir I. Okhmatovski, Member, IEEE, Unification of Double Delay and SOC Electromagnetic De-embedding, MTT-2758 Rautio and Okmatovski, May 16, 2005, 8 pgs.
James C. Rautio, Fellow, IEEE, A Conformal Mesh for Efficient Planar Electromagnetic Analysis, IEEE Transactions on Microwave Theory and Techniques, vol. 52, No. 1, Jan. 2004, 8 pgs.
James C. Rautio, EM Approach Sets New Speed Records, Microwaves & RF, May 2002, 8 pgs.
Shawn Carpenter, Break and Interpolate Technique: A Strategy for fast EM Simulation of Planar Filters, Sonnet Technical Document Series as published in the Oct. 2000 issue of Microwave Product Digest, 18 pgs.
James C. Rautio, Synthesis of Lumped Models from N-Port Scattering Parameters Data, IEEE Transactions on Microwave Theory and Techniques, vol. 42, No. 3, Mar. 1994, 3 pgs.

(Continued)

*Primary Examiner*—Vuthe Siek
*Assistant Examiner*—Naum Levin
(74) *Attorney, Agent, or Firm*—Hiscock & Barclay, LLP; R. Stephen Rosenholm

(57) ABSTRACT

A method and apparatus for performing an electromagnetic analysis of an electrical circuit. One or more super-sections are each defined as electromagnetically isolated portions of an electrical circuit that can be analyzed and processed in parallel. Optionally and preferably, at least some of the super-sections are defined to overlap each other in order to support a range of continuity of analysis that prioritizes coverage based upon the proximity between ports of interest. As a result, the invention provides an improved combination of accuracy, efficiency and scalability relative to other known electromagnetic analysis techniques.

24 Claims, 19 Drawing Sheets

OTHER PUBLICATIONS

James C. Rautio, Testing Limits of Algorithms Associated with High Frequency Planar Electromagnetic Analysis, Sonnet Software, Inc., USA, 4 pgs.

Dr. James C. Rautio, Electromagnetic Analysis Speeds RFID Design, Sonnet Software, Inc., Published in Microwaves & RF, Feb. 2003, 13 pgs.

James C. Rautio, Free EM Simulator Analyzes Spiral Inductor on Silicon, Published in Microwaves & RF Magazine, Sep. 1999, 14 pgs.

James C. Rautio, Tips and Tricks for Using Sonnet® Lite, First published in Microwave Product Digest, Oct. 1999, 13 pgs.

James C. Rautio, Rigorous Evaluation of Worst Case Total Crosswalk in the Time domain Using Frequency Domain Scattering Parameters, DesignCon 2001, 10 pgs.

James C. Rautio, Applied Numerical Electromagnetic Analysis For Planar High-Frequency Circuits, 16 pgs.

James C. Rautio, the Impact on Eductation of Widely Available Commercial 3-D Planar Electromagnetic Software, Computer Application in Engineering Education, 18 pgs.

James C. Rautio, *Fellow, IEEE*, and Veysel Demir, *Student Member, IEEE*, Microstrip Conductor Loss Models for Electromagnetic Analysis, IEEE Transactions on Microwave Theory and Techniques, vol. 51, No. 3, Mar. 2003, 7 pgs.

James C. Rautio, Planar Electromagnetic Analysis, IEEE Microwave Magazine, 2003, 7 pgs.

Sonnet Software Inc., Planar EM Analysis: A New Standard for High Frequency Applications, Microwave Journal, Nov. 2004, 4 pgs.

James C. Rautio, Member, IEEE, and Roger F. Harrington, Fellow, IEEE, An Electromagnetic Time-Harmonic Analysis of Shielded Microstrip Circuits, IEEE Transactions on Microwave Theory and Techniques, vol. MTT-35, No. 8, Aug. 1987, 5 pgs.

James C. Rautio, A De-Embedding Algorithm, for Electromagnetics, International Journal of Microwave and Millimeter-Wave Computer-Aided Engineering, vol. 1 No. 3 282-287, 1991, 6 pgs.

James C . Rautio, Application Notes, An Investigation of Microchip Conductor Loss, Microwave, Dec. 2000, 8 pgs.

James C. Rautio, Planar Electromagnetic Software-Personal Reflections, Microwave Journal, Mar. 2005, 5 pgs.

FIG. 6A

|   | A | B | C | D | E | F | G | H | I | J | K | L | M | N | O | P |
|---|---|---|---|---|---|---|---|---|---|---|---|---|---|---|---|---|
| A | 0.21 43 |   |   |   |   |   |   |   |   |   |   |   |   |   |   |   |
|   | 0.01 63 |   |   |   |   |   |   |   |   |   |   |   |   |   |   |   |
| B | 0.01 63 |   |   |   |   |   |   |   |   |   |   |   |   |   |   |   |
|   | 0.45 -47 |   |   |   |   |   |   |   |   |   |   |   |   |   |   |   |
| C |   |   |   |   |   |   |   |   |   |   |   |   |   |   |   |   |
| D |   |   |   |   |   |   |   |   |   |   |   |   |   |   |   |   |
| E | 0.98 -45 |   |   |   | 0.98 -45 |   |   |   |   |   |   |   |   |   |   |   |
|   | 147 |   |   |   | -176 |   |   |   |   |   |   |   |   |   |   |   |
| F | 0.01 113 | 0.89 -173 |   |   | 0.00 -176 | 0.89 -173 |   |   |   |   |   |   |   |   |   |   |
|   | -173 |   |   |   |   | -173 |   |   |   |   |   |   |   |   |   |   |
| G | 0.00 147 | 0.01 -114 |   |   | 0.21 46 | 0.01 -106 | 0.00 11 |   |   |   |   |   |   |   |   |   |
|   |   |   |   |   | 0.01 -106 | 0.45 -119 | 0.01 -115 |   |   |   |   |   |   |   |   |   |
| H |   |   |   |   | 0.00 11 | 0.01 -115 | 0.36 11 |   |   |   |   |   |   |   |   |   |
| I | 0.00 37 | 0.01 44 |   |   |   |   |   |   | 0.00 123 | 0.00 126 |   |   | 0.00 119 |   |   |   |
|   |   |   |   |   |   |   |   |   | 0.01 42 | 0.00 -91 |   |   |   |   |   |   |
| J | 0.00 -10 | 0.00 -101 |   |   |   |   |   |   | 0.93 -81 | 0.01 177 |   |   | 0.00 1 |   |   |   |
|   |   |   |   |   | 0.00 123 | 0.01 42 | 0.93 -81 |   |   |   |   |   |   |   |   |   |
| K |   |   |   |   | 0.00 126 | 0.00 -91 | 0.01 177 |   | 0.36 8 | 0.01 -89 |   |   | 0.00 90 |   |   |   |
|   |   |   |   |   |   |   |   |   | 0.01 -89 | 1.00 -9 |   |   |   |   |   |   |
| L |   |   |   |   |   |   |   |   |   |   |   |   | 0.00 3 |   |   |   |
|   |   |   |   |   |   |   |   |   |   |   |   |   | 0.00 82 |   |   |   |
| M | 0.00 -9 | 0.00 -3 |   |   |   |   |   |   |   |   |   |   |   |   |   |   |
| N |   |   |   |   | 0.00 119 |   | 0.00 90 |   | 0.00 3 | 0.00 82 |   |   | 1.00 -8 |   |   |   |
| O |   |   |   |   |   |   |   |   |   |   |   |   |   |   |   |   |
| P |   |   |   |   |   |   |   |   |   |   |   |   |   |   |   |   |

FIG. 6B

| | A | B | C | D | E | F | G | H | I | J | K | L | M | N | O | P |
|---|---|---|---|---|---|---|---|---|---|---|---|---|---|---|---|---|
| A | | | | | | | | | | | | | | | | |
| B | | 0.53<br>-50 | 0.00<br>141 | | | 0.85<br>-167 | 0.01<br>-91 | 0.00<br>26 | 0.01<br>44 | 0.00<br>-2 | 0.00<br>17 | 0.00<br>-100 | 0.00<br>11 | 0.00<br>48 | 0.00<br>-48 | |
| C | | 0.00<br>141 | 0.54<br>-50 | | | 0.00<br>132 | 0.00<br>-130 | 0.00<br>-167 | 0.00<br>83 | 0.00<br>-159 | 0.00<br>-179 | 0.01<br>-135 | 0.00<br>-153 | 0.01<br>92 | 0.84<br>16 | |
| D | | | | | | | | | | | | | | | | |
| E | | | | | | | | | | | | | | | | |
| F | | 0.85<br>-167 | 0.00<br>132 | | | 0.53<br>-103 | 0.01<br>-96 | 0.00<br>-91 | 0.01<br>37 | 0.00<br>5 | 0.00<br>22 | 0.00<br>-109 | 0.00<br>12 | 0.00<br>39 | 0.00<br>-57 | |
| G | | 0.01<br>-91 | 0.00<br>-130 | | | 0.01<br>-96 | 0.36<br>12 | 0.01<br>-91 | 0.93<br>-81 | 0.00<br>154 | 0.00<br>133 | 0.00<br>-11 | 0.00<br>69 | 0.00<br>162 | 0.00<br>41 | |
| H | | 0.00<br>26 | 0.00<br>-167 | | | 0.00<br>15 | 0.01<br>-91 | 1.00<br>-9 | 0.01<br>-177 | 0.00<br>49 | 0.00<br>-87 | 0.00<br>-27 | 0.00<br>-93 | 0.00<br>80 | 0.00<br>13 | |
| I | | 0.01<br>44 | 0.00<br>83 | | | 0.01<br>37 | 0.93<br>-81 | 0.01<br>-177 | 0.36<br>6 | 0.01<br>-78 | 0.01<br>-15 | 0.36<br>6 | 0.01<br>-177 | 0.00<br>165 | 0.00<br>-105 | |
| J | | 0.00<br>-2 | 0.00<br>-159 | | | 0.00<br>5 | 0.00<br>154 | 0.00<br>49 | 0.01<br>-78 | 1.00<br>-10 | 0.00<br>-102 | 0.00<br>-24 | 0.00<br>-93 | 0.00<br>134 | 0.00<br>24 | |
| K | | 0.00<br>17 | 0.00<br>-179 | | | 0.00<br>22 | 0.00<br>133 | 0.00<br>-87 | 0.01<br>-15 | 0.00<br>-102 | 1.00<br>-10 | 0.01<br>-83 | 0.01<br>59 | 0.00<br>161 | 0.00<br>6 | |
| L | | 0.00<br>-100 | 0.01<br>-135 | | | 0.00<br>-109 | 0.00<br>-11 | 0.00<br>-27 | 0.36<br>6 | 0.00<br>-24 | 0.01<br>-83 | 0.36<br>7 | 0.01<br>-177 | 0.93<br>-82 | 0.01<br>38 | |
| M | | 0.00<br>11 | 0.00<br>-153 | | | 0.00<br>12 | 0.00<br>69 | 0.00<br>-93 | 0.01<br>-177 | 0.00<br>-93 | 0.01<br>59 | 0.01<br>-177 | 1.00<br>-9 | 0.01<br>-91 | 0.01<br>16 | |
| N | | 0.00<br>48 | 0.01<br>92 | | | 0.00<br>39 | 0.00<br>162 | 0.00<br>80 | 0.00<br>165 | 0.00<br>134 | 0.00<br>161 | 0.93<br>-82 | 0.01<br>-91 | 0.36<br>10 | 0.01<br>-93 | |
| O | | 0.00<br>-48 | 0.84<br>16 | | | 0.00<br>-57 | 0.00<br>41 | 0.00<br>13 | 0.00<br>-105 | 0.00<br>24 | 0.00<br>6 | 0.01<br>38 | 0.01<br>16 | 0.01<br>-93 | 0.54<br>-98 | |
| P | | | | | | | | | | | | | | | | |

FIG. 6C

| | A | B | C | D | E | F | G | H | I | J | K | L | M | N | O | P |
|---|---|---|---|---|---|---|---|---|---|---|---|---|---|---|---|---|
| A | | | | | | | | | | | | | | | | |
| B | | | | | | | | | | | | | | | | |
| C | | | 0.46 / -49 | 0.01 / -114 | | | | | | | 0.00 / 66 | 0.01 / -135 | | 0.01 / 69 | 0.88 / 10 | 0.00 / 7 |
| D | | | 0.01 / -114 | 0.21 / 43 | | | | | | | 0.00 / -10 | 0.00 / 35 | | 0.00 / 152 | 0.01 / 117 | 0.98 / -45 |
| E | | | | | | | | | | | | | | | | |
| F | | | | | | | | | | | | | | | | |
| G | | | | | | | | | | | | | | | | |
| H | | | 0.00 / -180 | 0.00 / -13 | | | | 1.00 / -8 | | | 0.00 / 76 | 0.00 / 2 | | 0.00 / 90 | 0.00 / 4 | 0.00 / 120 |
| I | | | | | | | | | | | | | | | | |
| J | | | | | | | | | | | | | | | | |
| K | | | 0.00 / 66 | 0.00 / -10 | | | | 0.00 / 76 | | | 1.00 / -9 | 0.01 / -94 | | 0.01 / -171 | 0.00 / -125 | 0.00 / 125 |
| L | | | 0.01 / -135 | 0.00 / 35 | | | | 0.00 / 2 | | | 0.01 / 94 | 0.36 / 9 | | 0.93 / -81 | 0.01 / 43 | 0.00 / 140 |
| M | | | | | | | | | | | | | | | | |
| N | | | 0.01 / 69 | 0.00 / 152 | | | | 0.00 / 90 | | | 0.01 / -171 | 0.93 / -81 | | 0.36 / 8 | 0.01 / -111 | 0.00 / 9 |
| O | | | 0.88 / 10 | 0.01 / 117 | | | | 0.00 / 4 | | | 0.00 / -125 | 0.01 / 43 | | 0.01 / -111 | 0.46 / -112 | 0.01 / -105 |
| P | | | 0.00 / 7 | 0.98 / -45 | | | | 0.00 / 120 | | | 0.00 / 125 | 0.00 / 140 | | 0.00 / 9 | 0.01 / -105 | 0.21 / 46 |

FIG. 7A

FIG. 7B $$S = S_{\text{(reduced)} \atop (n-2)(n-2)} + S_{\text{(un-reduced)} \atop (n-2)(n-2)} \begin{bmatrix} S_{1x} & S_{1y} \\ \vdots & \vdots \\ S_{(n-2)x} & S_{(n-2)y} \end{bmatrix} \begin{bmatrix} S_{Q11} & S_{Q12} \\ S_{Q21} & S_{Q22} \end{bmatrix} \begin{bmatrix} S_{x1} & \cdots & S_{x(n-2)} \\ S_{y1} & \cdots & S_{y(n-2)} \end{bmatrix}$$

$\uparrow 780 \qquad \uparrow 782 \qquad \uparrow 784 \qquad \uparrow 786 \qquad \uparrow 788$ $$S_Q = \begin{bmatrix} S_{Q11} & S_{Q12} \\ S_{Q21} & S_{Q22} \end{bmatrix} = \frac{\begin{bmatrix} S_{xx} & 1-S_{xy} \\ 1-S_{yx} & S_{yy} \end{bmatrix}}{(1-S_{xy})(1-S_{yx})-S_{xx}S_{yy}}$$

$\uparrow 790 \qquad \uparrow 792 \qquad \uparrow 794$

|   | A | B | C | D | E | F | G | H | I | J | K | L | M | N | O | P |
|---|---|---|---|---|---|---|---|---|---|---|---|---|---|---|---|---|
| A | 0.48<br>134 | 0.87<br>141 | 0.00<br>73 | 0.00<br>-154 | | | | | | | | | | | | |
| B | 0.87<br>141 | 0.48<br>-32 | 0.00<br>122 | 0.00<br>-105 | | | | | | | | | | | | |
| C | 0.00<br>73 | 0.00<br>122 | 0.45<br>-26 | 0.89<br>-42 | | | | | | | | | | | | |
| D | 0.00<br>154 | 0.00<br>-105 | 0.89<br>-42 | 0.44<br>122 | | | | | | | | | | | | |
| E | | | | | | | | | | | | | | | | |
| F | | | | | | | | | | | | | | | | |
| G | | | | | | | | | | | | | | | | |
| H | | | | | | | | | | | | | | | | |
| I | | | | | | | | | | | | | | | | |
| J | | | | | | | | | | | | | | | | |
| K | | | | | | | | | | | | | | | | |
| L | | | | | | | | | | | | | | | | |
| M | | | | | | | | | | | | | | | | |
| N | | | | | | | | | | | | | | | | |
| O | | | | | | | | | | | | | | | | |
| P | | | | | | | | | | | | | | | | |

FIG. 8

$$Z_{12} = \frac{V_1}{I_2} \text{ where } I_1 = 0 \quad \leftarrow 810$$

$$V_N = Z_N I_N \quad \leftarrow 820$$

$$\begin{bmatrix} V_n \\ V_s \end{bmatrix} = \begin{bmatrix} Z_{NN} & Z_{nS} \\ Z_{SN} & Z_{SS} \end{bmatrix} \begin{bmatrix} I_n \\ I_s \end{bmatrix} \quad \leftarrow 830$$

$$\uparrow \quad\quad \uparrow \quad\quad \uparrow$$
$$832 \quad\quad 834 \quad\quad 836$$

$$848$$

$$\begin{bmatrix} I_N \\ I_S \end{bmatrix} = \begin{bmatrix} Y_{NN} & Y_{NS} \\ Y_{SN} & Y_{SS} \end{bmatrix} \begin{bmatrix} V_N \\ V_S \end{bmatrix} \quad \leftarrow 840$$

$$\uparrow \quad\quad \uparrow \quad\quad \uparrow$$
$$842 \quad\quad 844 \quad\quad 846$$

$$I_N = Y_{NN} V_N \quad \leftarrow 850$$

$$\uparrow \quad \uparrow \quad \nwarrow$$
$$852 \quad 848 \quad 854$$

$$Z_N = Y_{NN}^{-1} \quad \leftarrow 860$$

$$\uparrow \quad\quad \uparrow$$
$$862 \quad\quad 864$$

FIG. 9

$$Y_{12} = \frac{I_1}{V_2} \quad \text{where } V_1 = 0 \quad \leftarrow 910$$

$$I_N = Y_N V_N \quad \leftarrow 920$$

$$\begin{bmatrix} I_n \\ I_s \end{bmatrix} = \begin{bmatrix} Y_{NN} & Y_{NS} \\ Y_{SN} & Y_{SS} \end{bmatrix} \begin{bmatrix} V_n \\ V_s \end{bmatrix} \quad \leftarrow 930$$
↑ 932  ↑ 948  ↑ 934  ↑ 936

$$\begin{bmatrix} V_N \\ V_s \end{bmatrix} = \begin{bmatrix} Z_{NN} & Z_{NS} \\ Z_{SN} & Z_{SS} \end{bmatrix} \begin{bmatrix} I_N \\ I_s \end{bmatrix} \quad \leftarrow 940$$
↑ 942  ↑ 744  ↑ 946

$$V_N = Z_{NN} I_N \quad \leftarrow 950$$
↑ 952  ↑ 948  ↑ 954

$$Y_N = Z_{NN}^{-1} \quad \leftarrow 960$$
↑ 962  ↑ 964

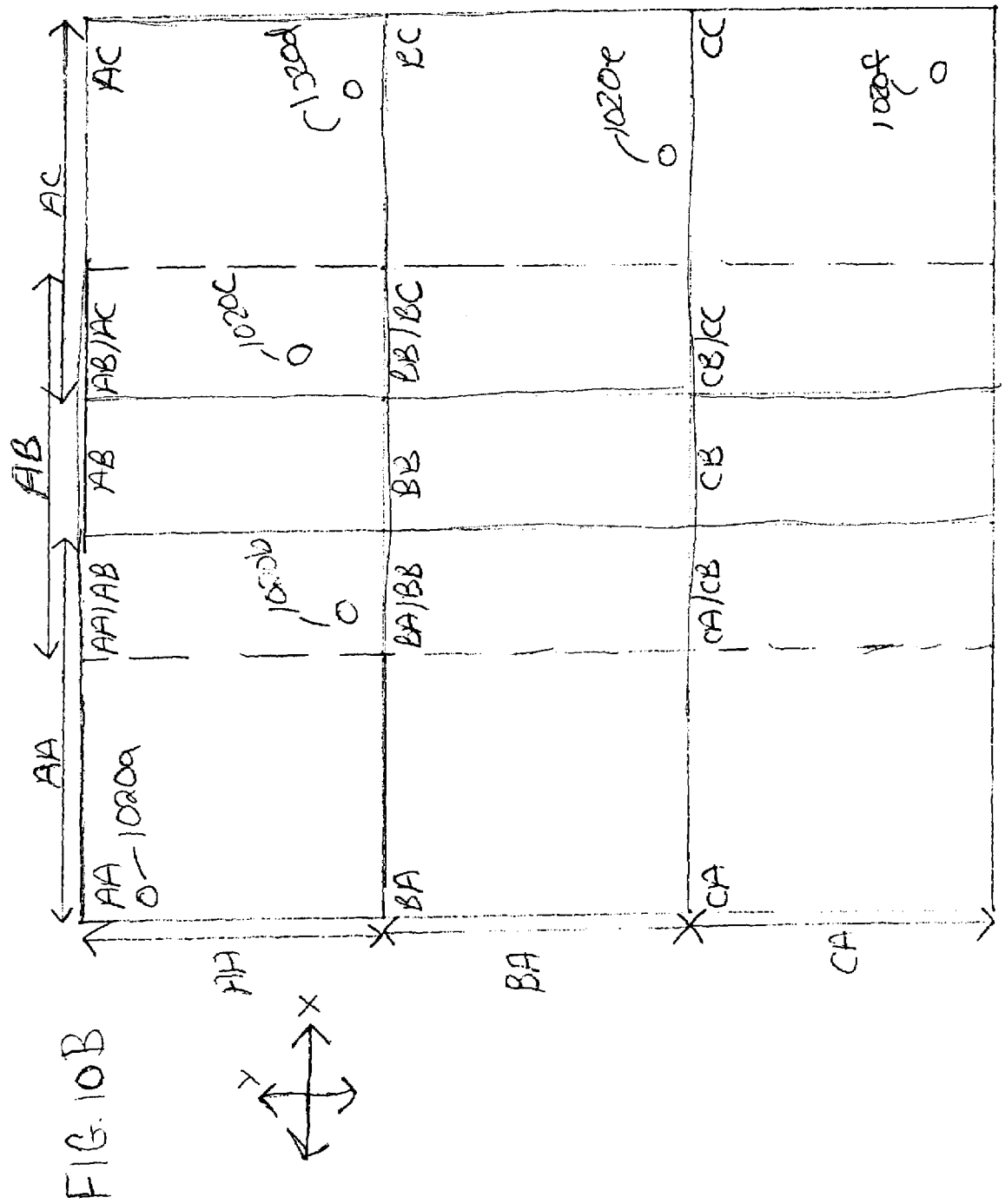

METHOD AND APPARATUS FOR RAPID ELECTROMAGNETIC ANALYSIS

CROSS-REFERENCE TO RELATED APPLICATIONS

This non-provisional patent application claims priority to a provisional patent application Ser. No. 60/685,646 filed May 27, 2005 which is hereby incorporated by reference in its entirety.

FIELD OF THE INVENTION

This invention relates generally to a method and apparatus for performing electromagnetic analysis of an electrical circuit, and specifically to a method and apparatus for performing electromagnetic analysis of large electrical circuits that provides an improved combination of accuracy, efficiency and scalability.

BACKGROUND OF THE INVENTION

The electromagnetic analysis involves quantifying one or more electro-magnetic interactions between various components of an electrical circuit. The flows of electrical current traveling through the components of an electrical circuit generate electro-magnetic fields. These electro-magnetic fields interact with each other in complex ways that can effect, promote and possibly interfere with the intended behavior of the electrical circuit. As a result, electro-magnetic analysis can assist the process of electrical circuit design. Currently, many electro-magnetic analysis techniques, having different relative strengths and weaknesses, are available to assist with electrical circuit design.

For example, the Method of Moments technique provides electromagnetic analysis but requires analysis time that grows substantially more than linearly with the size of the electrical circuit being analyzed and consequently, has limited scalability with respect to the analysis of large electrical circuits.

The Divide and Conquer technique provides relative scalability to the Method of Moments technique, but it is vulnerable to inconsistent and limited accuracy where discontinuities (blind spots) within its analysis coverage can result in the lack of detection of substantial electromagnetic coupling between components proximate to each other. By itself, this technique is not considered an EM analysis technique, but it can be used in combination with an EM analysis technique, such as the Method of Moments.

The Domain Decomposition technique provides relatively continuous analysis coverage as compared to the Divide and Conquer technique, but it also provides iterative (non-closed form) analysis and is consequently, relatively inefficient with respect to the analysis time required in proportion to the size of the electrical circuit being analyzed.

The Partial Element Equivalent Circuit technique also provides relatively continuous analysis coverage relative to the Divide and Conquer technique, but has limited accuracy and it is not readily adapted to parallel processing and consequently, has limited scalability with respect to the analysis of large electrical.

SUMMARY OF THE INVENTION

The invention provides a method and apparatus for performing an electromagnetic analysis of an electrical circuit. In accordance with the invention, one or more super-sections are each defined as electromagnetically isolated portions of an electrical circuit that can be analyzed and processed in parallel. Optionally and preferably, at least some of the super-sections are defined to overlap each other in order to support a range of continuity of analysis that prioritizes coverage based upon a selected proximity between ports of interest. Accordingly, the invention efficiently determines electromagnetic coupling between any and all ports of interest that are located within a selected range of proximity to each other. As a result, the invention provides an improved combination of accuracy, efficiency and scalability relative to other known electromagnetic analysis techniques.

In one aspect, the invention provides a method for performing electromagnetic analysis of an electrical circuit structure, comprising the steps of providing a representation of an electrical circuit structure including at least one conductor and at least one nominal port of interest, defining one or more distinct super-sections, each one of the distinct super-sections is bounded by a perimeter, the distinct super-sections include a first super-section and a second super-section, the first super-section includes a nominal port of interest and the second super-section includes a first portion of the at least one conductor, and defining an interior section perimeter within the second super-section that is located away from said perimeter of the second super-section and that intersects the first portion of the at least one conductor and that partitions the second super-section into at least two distinct sections, and defining at least one interior isolating port within the second super-section, the interior isolating port being located at a first circuit location along the first portion of the at least one conductor and located at or adjacent to an intersection of the interior section perimeter and the first portion of the at least one conductor, the at least one interior isolating port functioning to provide at least some electro-magnetic isolation between at least two distinct sections located within the second distinct super-section, and providing an electrical connection from the at least one interior isolating port to one consistent and pre-determined ground potential that is not otherwise provided to the at least one interior isolating port within the circuit representation and determining an electro-magnetic coupling between the at least said one nominal port of interest and the interior isolating port.

In some embodiments, the first distinct super-section and the second distinct super-section are the same super-section. In other embodiments, the first distinct super-section and said second distinct super-section at least partially overlap each other. In some embodiments, the interior isolating port is assigned to a same location as a pre-existing port.

Optionally, the interior isolating port is a series-shunt isolating port or a shunt isolating port. Optionally, the electromagnetic coupling is determined in terms including scattering (S) parameters and/or determined in terms including admittance (Y) parameters and/or determined in terms including impedance (Z) parameters and/or determined using a reduced order model of at least a portion of said electrical circuit structure. In one type of embodiment, the reduced order model utilizes a lumped model. In another type of embodiment, the reduced order model utilizes a Pade rational polynomial.

In some embodiments, determining an electromagnetic coupling includes simulating the electromagnetic behavior of at least one super-section while electro-magnetically isolating the super-section and while applying an electrical stimulus to the super-section. In this type of embodiment, a computer can be employed for simulating the electromagnetic behavior of the super-section by simulating the isolation of the super-section and by simulating the application of an electrical stimulus to the super-section.

In some embodiments, the step of determining the electromagnetic coupling between two ports that are located within the same super-section ignores electromagnetic coupling associated with any port residing outside of the super-section.

In some embodiments, this method includes a step of dividing the electrical circuit structure into a plurality of disjoint sections using one or more section dividing surfaces and defining each distinct super-section as a unique grouping of one or more disjoint sections. In some embodiments, a union of the one or more super-sections includes the entire said electrical circuit structure.

In some embodiments, at least two distinct super-sections at least partially overlap each other and where a circuit location and a port located at the circuit location is located within both said two distinct super-sections. Optionally, in this type of embodiment, a first port is located at said first circuit location within the first super-section and the interior isolating port is located at the first circuit location within the second super-section, and where a first electromagnetic coupling value for the first port is determined as a result of the electro-magnetic analysis of the first super-section and where a second electromagnetic coupling value for the interior isolating port is determined as a result of the electro-magnetic analysis of the second super-section and where a combined electromagnetic coupling value representing a combined result of the electro-magnetic analysis of the first and second super-sections is determined from an arbitration between said first and said second electromagnetic coupling values.

In one variation of this type of embodiment, the combined electromagnetic coupling value is equal to the first electromagnetic coupling value if the proximity of the first port relative to the perimeter of the first super-section is less than the proximity of the second port relative to the perimeter of the second super-section and if otherwise, the combined electromagnetic coupling value is equal to the second electromagnetic coupling value. In another variation of this type of embodiment, the combined electromagnetic coupling value is equal to an average of the first electromagnetic coupling value and said second electromagnetic coupling value. In another aspect, the invention is an apparatus for performing an electromagnetic analysis of an electrical circuit structure, comprising a software module configured for inputting a representation of an electrical circuit structure; and for defining a pair of distinct super-sections, each one of the distinct super-sections having a perimeter, the distinct super-sections include a first super-section and a second super-section that each include a first common location that is located within both the first super-section and the second super-section, and where the first super-section includes a first common port that is located at the first common location and includes a first uncommon port that is located at a first uncommon location, the first uncommon location is not located within the second super-section, and where the second super-section includes a second common port that is located at the first common location and includes a second uncommon port that is located at a second uncommon location, the second uncommon location is not located within the first super-section and where the software module is configured for determining an electro-magnetic coupling between said first uncommon port and said second uncommon port by performing a first electro-magnetic analysis of the first super-section, by performing a second electro-magnetic analysis of the second super-section and by combining the results of the first electro-magnetic analysis and the second electro-magnetic analysis. In some embodiments, the software module is further configured for providing an at least one electrical connection from the first common port and/or from the second common port to one consistent and pre-determined ground potential that is not otherwise provided to the first common port and/or the second common port.

In some embodiments, the first common port and/or the second common port is an exterior port. In some embodiments, the first common port and/or the second common port is an interior port. In some embodiments, the first common port and/or the second common port is an isolating port. In some embodiments, the first common port and/or the second common port is a nominal port. Optionally, the electromagnetic coupling is determined in terms of scattering (S) parameters and/or admittance (Y) parameters and/or in terms of impedance (Z) parameters.

BRIEF DESCRIPTION OF THE DRAWINGS

For a further understanding of these and objects of the invention, reference will be made to the following detailed description of the invention which is to be read in connection with the accompanying drawings, wherein:

FIG. 6A is a matrix illustrating scattering (S) parameter electromagnetic coupling values determined from the results of the electromagnetic analysis of the first super-section.

FIG. 6B is a matrix illustrating scattering (S) parameter electromagnetic coupling values determined from the results of the electromagnetic analysis of the second super-section.

FIG. 6C is a matrix illustrating scattering (S) parameter electromagnetic coupling values determined from the results of the electromagnetic analysis of the third super-section.

FIG. 7A is a matrix illustrating scattering (S) parameter electromagnetic coupling values determined from the combined results of the electromagnetic analysis of all three super-sections.

FIG. 7B illustrates a set of mathematical operations utilized for employing scattering (S) parameters for electromagnetic analysis and for eliminating the effect of one or more sampling ports that are implemented as series-shunt ports located within one or more super-sections.

FIG. 7C illustrates a partially reduced matrix that is transformed from the un-reduced matrix of FIG. 7A by eliminating the effect of one sampling port.

FIG. 7D illustrates a fully reduced matrix resulting from the elimination of the effect of one or more sampling ports.

FIG. 8 illustrates a set of mathematical operations utilized for employing impedance (Z) parameters for electromagnetic analysis and for eliminating the effect of one or more sampling ports that are implemented as gap ports located within one or more super-sections.

FIG. 9 illustrates a set of mathematical operations utilized for employing admittance (Y) parameters for electromagnetic analysis and for eliminating the effect of one or more sampling ports that are implemented as shunt ports located within one or more super-sections.

FIG. 10B illustrates the (9) super-sections of FIG. 10A that are re-arranged to uniformly overlap each other along a direction of a horizontal X axis.

DETAILED DESCRIPTION OF THE INVENTION

Figure 1A:
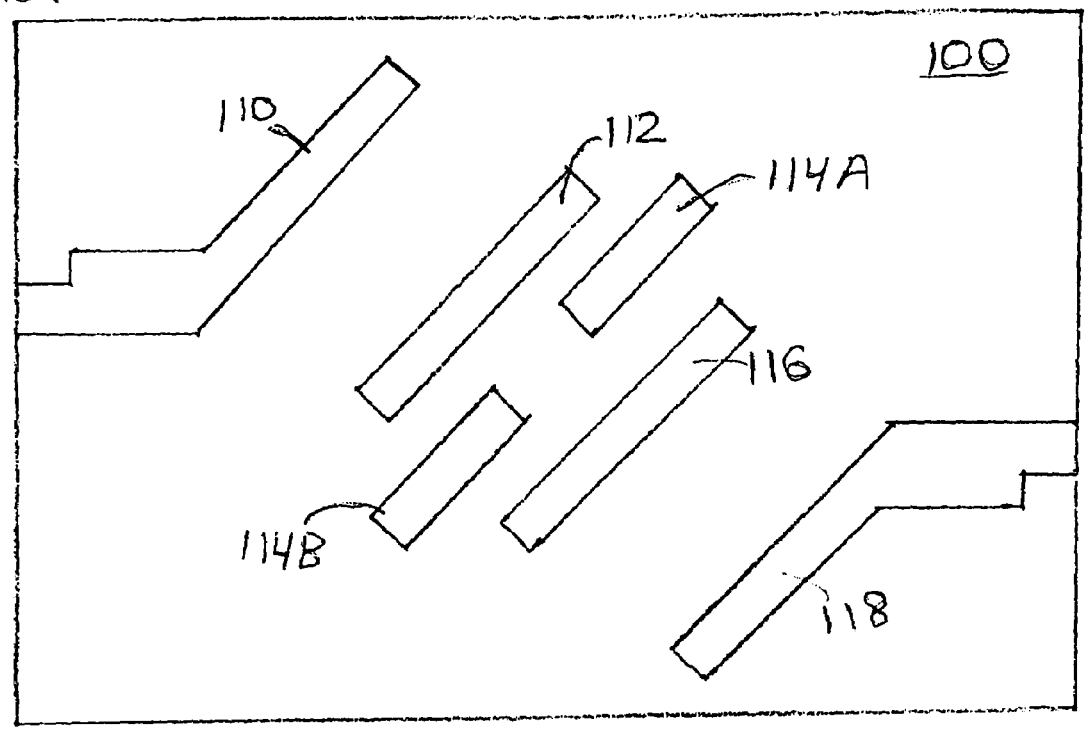
FIG. 1A is a top view of a representation of at least a portion of a multi-level planar electrical circuit.

FIG. 1A is a top view of a representation 100 of at least a portion of the content of an electrical circuit. The representation 100, also referred to as a circuit representation 100 or electrical circuit 100, illustrates a simplified version of a resonator band pass filter. The electrical circuit 100 includes an upper plane (shown) and lower planes (not shown). As shown, the upper plane includes (5) conductive portions, also referred to as conductors 110, 112, 114A, 114B, 116 and 118.

The circuit representation 100 does not necessarily illustrate all of the content, nor illustrate the exact scale or exact arrangement of the content of the electrical circuit. The representation characterizes the relative locations of conductors and/or other electronic components included within the portion of the electrical circuit for the purpose of performing an electromagnetic analysis. For ease of description, the representation 100 will hereafter also be referred to as the electrical circuit 100.

Figure 1B:
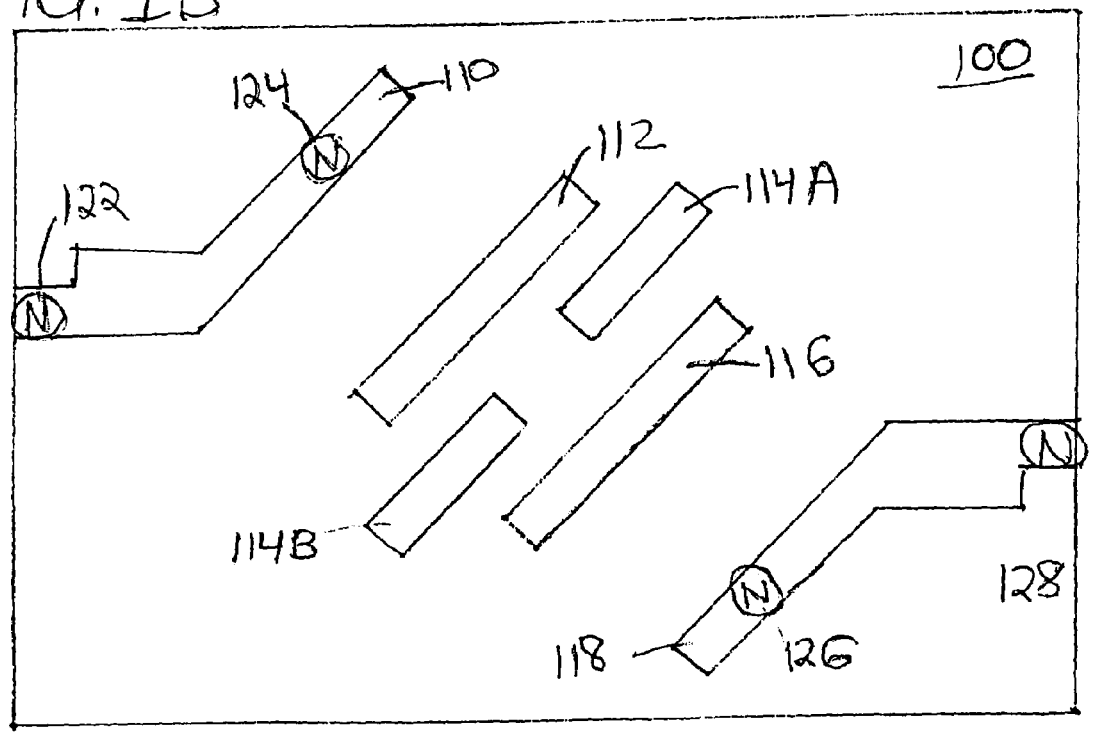
FIG. 1B illustrates the circuit representation of FIG. 1A further including markings defining the location of a plurality of nominal ports.

FIG. 1B illustrates the circuit representation 100 of FIG. 1A further including a plurality of nominal ports. As shown, the electrical circuit 100 includes four nominal ports 122, 124, 126 and 128 marked with the letter "N". Nominal ports 122 and 124 are located along conductor 110. Nominal ports 126 and 128 are located along conductor 118. No nominal ports are located along conductors 112, 114A, 114B and 116. With regard to the following description of an electromagnetic analysis of the electrical circuit 100, all nominal ports 122, 124, 126 and 128 are nominal ports of interest.

A nominal port of interest is a nominal port for which an associated electromagnetic effect upon an electrical circuit is desired to be known. Such an electromagnetic effect can be expressed in terms of an electromagnetic coupling value associated with and between separate nominal ports of interest, or expressed in terms of an electromagnetic coupling associated with only one nominal port of interest.

A nominal port is a port that is physically located within an original electrical circuit. Typically, at least some of the nominal ports of an original electrical circuit are included within a representation of the original electrical circuit. In theory, each nominal port that is located within an electrical circuit has an associated electromagnetic affect, however small, upon the electrical circuit.

A port is a pair of terminals (a first terminal and a second terminal) that are each electrically connected to an electrical circuit in such a manner that there exists a first amount of current, that if directed into a first terminal of the pair of terminals, causes at least a second amount current to flow out of the second terminal of the pair of terminals. The first and the second amounts of current may be equal.

In accordance with the following described embodiments of the invention, an electromagnetic analysis is performed on the representation of the electrical circuit 100. The goal of each electromagnetic analysis is to determine a set of electromagnetic coupling values associated with any nominal ports of interest. For convenience, the result of each electromagnetic analysis will be expressed as a set of electromagnetic coupling values arranged within a matrix having four rows and four columns, corresponding to the four nominal ports of interest.

Typically, an electromagnetic analysis is performed by executing a computer simulation of the electromagnetic behavior of at least a portion of the electrical circuit 100. The computer simulation is typically performed by computer software that processes data constituting a representation of at least a portion of the electrical circuit 100. The simulation software simulates (calculates) the flow of electrical current and the generation of electromagnetic fields, and the interaction between the flow of electrical current and the electromagnetic fields, located within at least a portion of the electrical circuit 100.

Figure 2A:
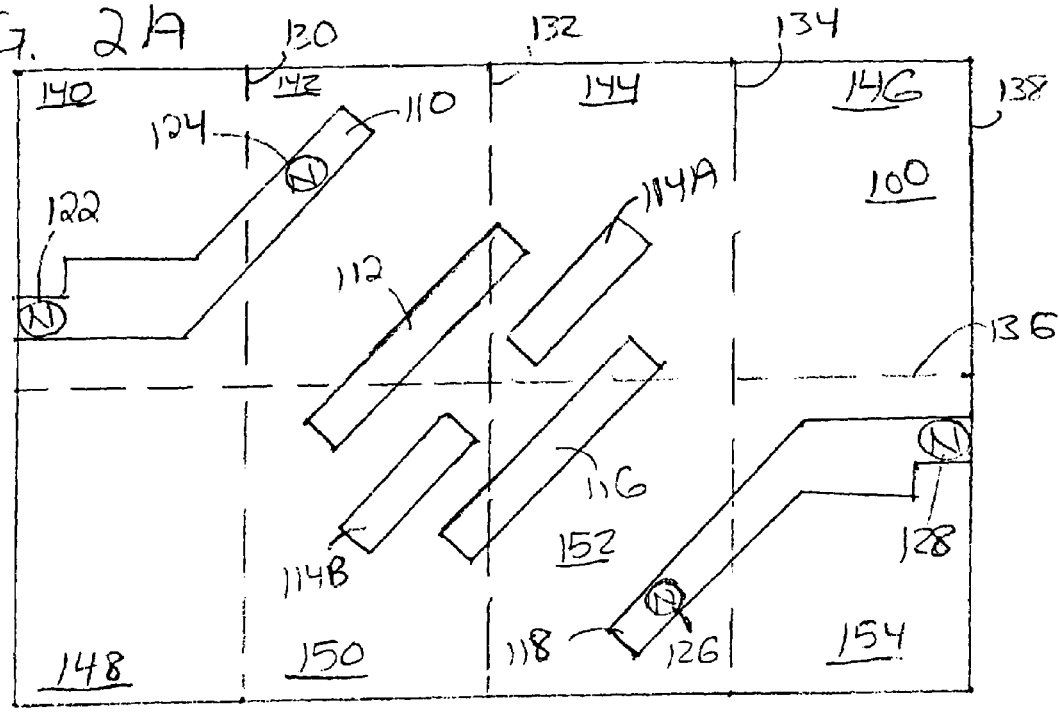
FIG. 2A illustrates the circuit representation of FIG. 1B further including section divider line markings defining the perimeters of a plurality of disjoint sections.

FIG. 2A illustrates the circuit representation 100 of FIG. 1B further including section divider line markings defining a plurality of disjoint sections 140-154. As shown, three vertical section divider line markings 130, 132 and 134 intersect a horizontal section divider line marking 136 to define eight disjoint sections. Although a union of the sections 140-154 would appear to cover the entire circuit 100, the invention does not require that the union of all super-sections cover the entire circuit 100. Further, although the sections 140-154 are shown as having substantially equal size and shape, the invention does not require sections to be of equal size or shape.

Each section divider line marking represents the intersection of a straight vertical section dividing surface 130, 132, 134 or a straight horizontal dividing surface 136 with the upper plane of the circuit 100. Other non-straight dividing surfaces, including segmented and/or variously curved section dividing surfaces may be used, provided that the electrical circuit 100 is divided into disjoint sections.

The area of each section 140-154 consists of an interior and a perimeter. The perimeter of each section 140-154 is a line located along the outer most portion of the area of each section 140-154. The interior of each section 140-154 is defined to be the area of the section excluding its perimeter. A portion of the perimeter of each section 140-154 may overlap a portion of the perimeter of one or more other sections 140-154.

For example, a portion of the perimeter of the section 140 and a portion of the perimeter of the section 148 overlap and with each other, and both portions overlap a portion of the horizontal section divider line marking 136. With respect to the description of the following embodiments, the perimeter 138 of the entire electrical circuit 100 also overlaps a portion of the perimeter of each of the sections 140-154.

The interior of each of the sections 140-154 is defined to be distinct and non-overlapping with the interior of any of the other sections 140-154. Notice that each of the sections 140-154 includes zero, one or more conductors and zero, one or more of the nominal ports 122-128. As shown, each of the nominal ports 122-128 is located entirely within the area of one of the sections 140-154.

For example, portions of the conductor 110 and the nominal port 122 are located within section 140. The conductors 110 and 112 and the nominal port 124 are located within section 142. The conductors 112, 114A and 116 are located within section 144. The conductors 112, 114B and 116 are located within section 150. The conductors 116 and 118 and the nominal port 126 are located within section 152. The conductor 118 and the nominal port 128 are located within section 154. No conductor or port is located within sections 146 and 148.

Figure 2B:
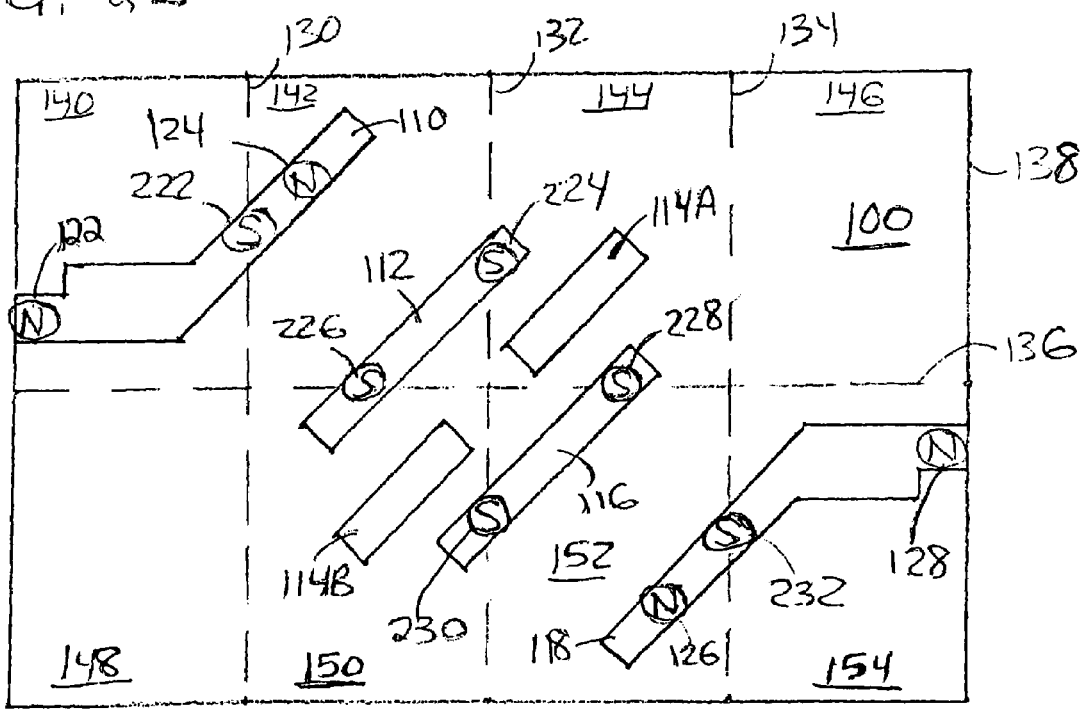
FIG. 2B illustrates the circuit representation of FIG. 2A further including markings defining the location of a plurality of sampling ports in accordance with the invention.

FIG. 2B illustrates the circuit representation of FIG. 2A further including markings defining the location of sampling ports in accordance with the invention. In accordance with the invention, a sampling port is preferably incorporated into the electrical circuit 100 a location where the perimeter of a section intersects a conductor. Sampling ports are used to assist the determination of the electromagnetic coupling associated with and between nominal ports located within the same super-section and/or or to isolate the super-section from the remainder of the electrical circuit 100. A sampling port can also be referred to as a type of isolating port depending upon its location within a super-section. All sampling ports are located along a perimeter of a section, but a sampling port is not necessarily located along a perimeter of a super-section. If a sampling port is also located along a perimeter of a super-section, it is also referred to as a perimeter isolating port. If a sampling port is located away from a perimeter of a super-section, it is also referred to as an interior isolating port.

As shown, a sampling port 222 is incorporated into the electrical circuit 100 at a location where the conductor 110 intersects a portion of the perimeter of the section 140 that overlaps the section divider line marking 130. Sampling port 224 is incorporated at a location where the conductor 112 intersects the perimeter of the sections 142 and 144 and the section divider line marking 132. Sampling port 226 is incorporated at a location where the conductor 112 intersects the perimeter of the sections 142 and 150 and section divider line marking 136.

Sampling port (228 is incorporated at a location where the conductor 116 intersects the perimeter of the sections 144 and 152 and section divider line marking 136. Sampling port 230 is incorporated at a location where the conductor 116 intersects the perimeter of the sections 150 and 152 and the section divider line marking 132. Sampling port 232 is incorporated into the electrical circuit 100 at a location where the conductor 118 intersects a portion of the perimeter of the sections 152 and 154 and the section divider line marking 134.

Figure 3A:
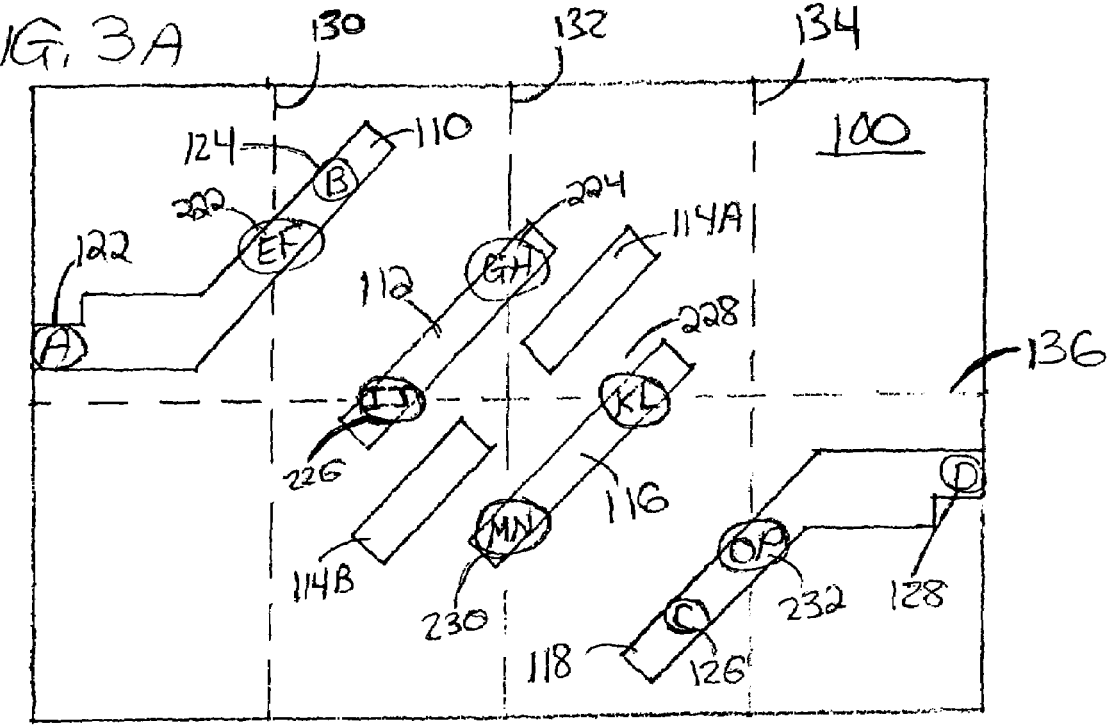
FIG. 3A illustrates the circuit representation of FIG. 2B further including markings assigning an alphabetic identifier to each nominal and each sampling port presented by the alphabetic identifiers.

FIG. 3A illustrates the circuit representation of FIG. 2B further including markings assigning an alphabetic identifier to each nominal port and each sampling port. Ports having a location that intersects a section perimeter (boundary), being all of the sampling ports as shown in FIG. 3A, are preferably implemented and are implemented in this example as "double ports", and are identified as by a pair of letters of the alphabet. A double port provides one port to function within each of a pair of sections separated by a section perimeter (boundary). Ports having a location that is not intersecting a section perimeter (boundary), for example the nominal ports as shown in FIG. 3A, are implemented in this example as single ports and are identified by a single letter of the alphabet. Optionally, any port, whether or not it has a location that is intersecting a section perimeter, such as the nominal ports as shown in FIG. 3A, can be implemented as a double port. Typically, a nominal port is implemented as a single port, but can be implemented as a plurality of ports. In other circumstances, nominal ports having a location at an intersection of a section perimeter (boundary) are preferably implemented as double ports and are also identified by a pair of letters of the alphabet.

Preferably, a double port is implemented as one series-shunt type of sampling port. A series-shunt sampling port is designed as a pair of shunt ports that are connected in series. Each of the pair of shunt ports of a series-shunt port can function as a separate port. Alternatively, a double port can be implemented as a pair of another type of port, such as implemented as a pair of gap ports or as a pair of shunt ports.

A double port can be divided into a pair of separate ports, where each separate port is located on opposite sides of a perimeter (boundary), such as located on the opposite sides of a section or a super-section perimeter. Conveniently, each of the pair of ports constituting a double port is identified by one of the two letters of the pair of letters identifying the double port.

Accordingly, the single port locations, being the nominal ports 122, 124, 126 and 128 are each represented by the alphabetic identifiers A, B, C and D respectively. The double port locations, being the sampling ports 222, 224, 226, 228, 230 and 232 are each represented by the alphabetic identifiers EF, GH, IJ, KL, MN and OP respectively.

Figure 3B:
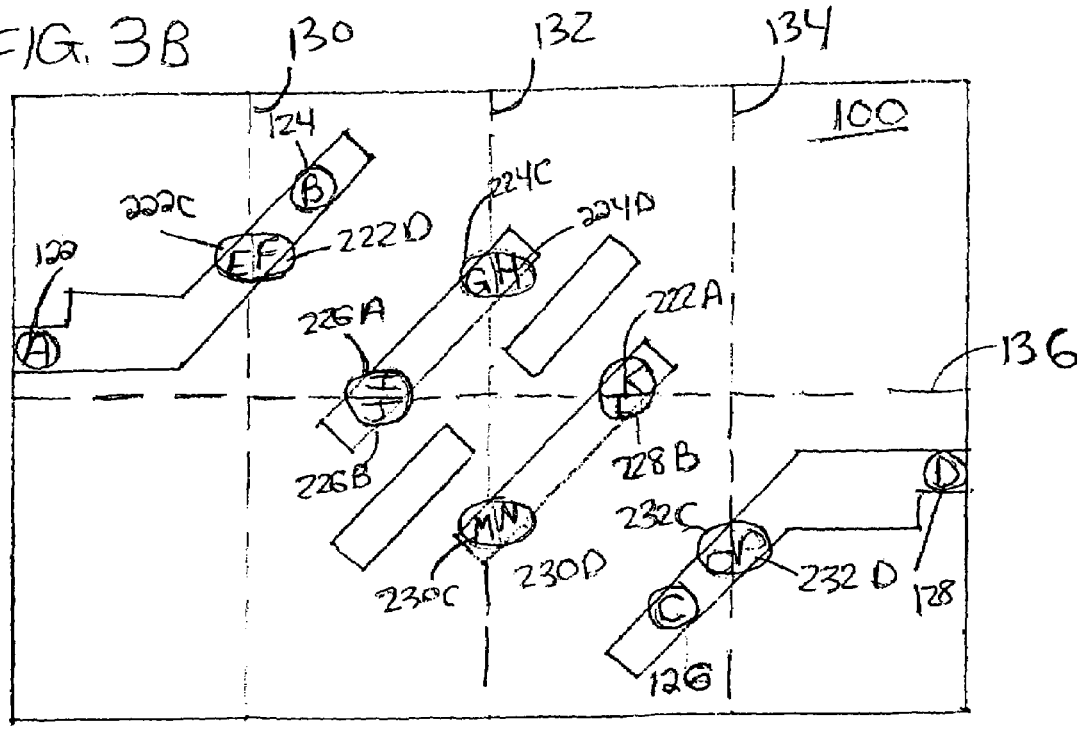
FIG. 3B illustrates the circuit representation of FIG. 3A further including markings assigning an alphabetic identifier to each half of each of the series shunt type of sampling ports.

FIG. 3B illustrates the circuit representation of FIG. 3A further including markings assigning a single alphabetic identifier to each of the pair of ports constituting a double port. The double ports, being the sampling ports, are each implemented as a series-shunt sampling port.

The sampling port location 222 (EF) is a series-shunt type of sampling port having a location that intersects a vertical section dividing line 130. The left half 222C and the right half 222D of the series shunt port 222, located on opposite sides of the vertical section dividing line 130, are also each assigned the alphabetic identifier (E) and (F) respectively.

The sampling port location 224 (GH) is a series-shunt type of sampling port having a location that intersects a vertical section dividing line 132. The left half 224C and the right half 224D of the series shunt port 224, located on opposite sides of the vertical section dividing line 132, are also each assigned the alphabetic identifier (G) and (H) respectively.

The sampling port location 226 (IJ) is a series-shunt type of sampling port having a location that intersects a horizontal section dividing line 136. The upper half 226A and the lower half 226B of the series shunt port 226 (IJ), located on opposite sides of the horizontal section dividing line 136, are also each assigned the alphabetic identifier (I) and (J) respectively.

The sampling port location 228 (KL) is a series-shunt type of sampling port having a location that intersects a horizontal section dividing line 136. The upper half 228A and the lower half 228B of the series shunt port 228 (KL), located on opposite sides of the horizontal section dividing line 136, are also each assigned the alphabetic identifier (K) and (L) respectively.

The sampling port location 230 (MN) is a series-shunt type of sampling port having a location that intersects a vertical section dividing line 132. The left half 230C and the right half 230D of the series shunt port 230, located on opposite sides of the vertical section dividing line 132, are also each assigned the alphabetic identifier (M) and (N) respectively.

The sampling port location 232 (OP) is a series-shunt type of sampling port having a location that intersects a vertical section dividing line 134. The left half 232C and the right half 232D of the series shunt port 232, located on opposite sides of the vertical section dividing line 134, are also each assigned the alphabetic identifier (O) and (P) respectively.

Figure 4B:
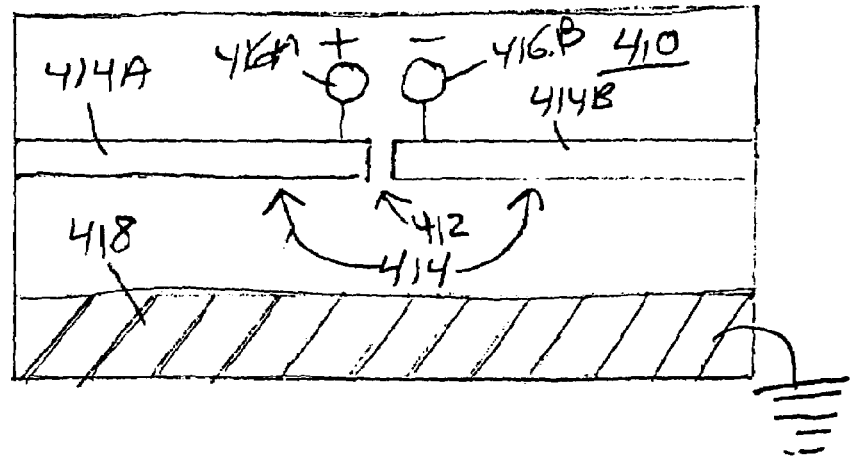
FIG. 4B illustrates a side perspective view of a gap isolation port.
Figure 4C:
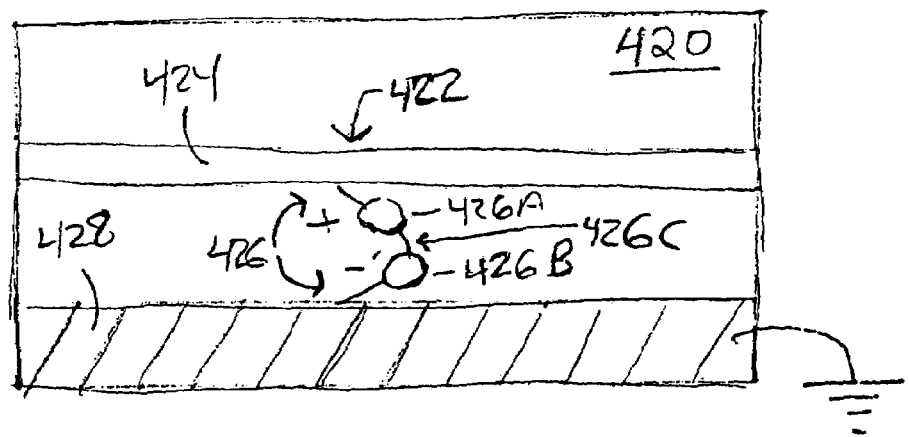
FIG. 4C illustrates a side perspective view of a shunt isolation port
Figure 4A:
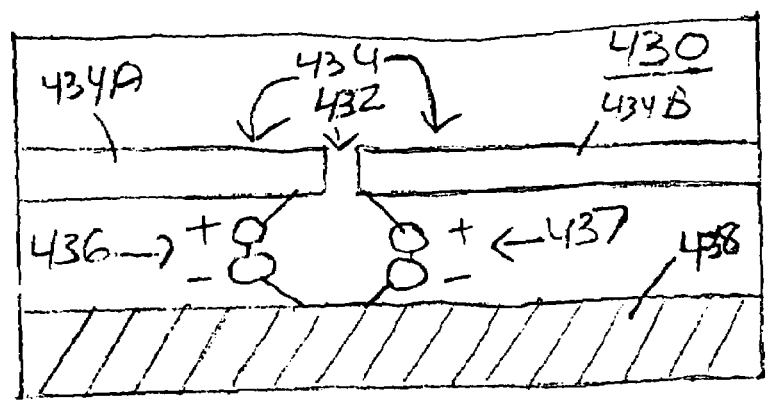
FIG. 4A illustrates a side perspective view of a series-shunt isolation port.

FIG. 4A illustrates a side perspective view of a series-shunt isolation port 430. As shown, the series-shunt isolation port 430 includes a gap 432 and a first shunt 436 (conductive pathway) that is connected from a first conductor segment 434A located on a first side of the gap 432 to a ground potential 438 and a second shunt 437 (conductive pathway) that is connected from a second conductor segment 434B located on a second side of the gap 432 to the ground potential 438.

When functioning as a sampling port, the gap is preferably located where the perimeter of a section or super-section intersects the conductor 434. The first shunt 436 directs current traveling within the section or super-section, through the conductor 434A to ground 438. The second shunt 437 directs current traveling outside of the super-section and through the conductor 434B to ground 438.

In some embodiments, an electromagnetic analysis method is performed using scattering (S) parameters. When using this type of (S parameter) electromagnetic analysis method, a microwave source generating an incident wave (a wave traveling from the source into the circuit) is supplied to a first port of interest and a resulting outgoing wave (a wave traveling outward from the circuit) is measured at a second port of interest while the super-section is electromagnetically isolated from the remainder of the electrical circuit. In some circumstances, the first and second ports are the same port. When the two ports are different, the outgoing wave is also referred to as a "transmitted wave". When the two ports are the same port, the outgoing wave is also referred to as a "reflected wave".

When using this type of (S parameter) electromagnetic analysis method, an isolation method incorporating one or more series-shunt isolation ports can provide substantial isolation to a section or super-section and is typically more effective than and preferred to, an isolating method incorporating either a gap isolation port or shunt isolation port.

Preferably, one type of port is uniformly employed throughout each and all of the super-sections to be analyzed and combined. For example, the selection of a series-shunt type of port as the type of port to be used within a super-section, prompts the selection and use of the series-shunt port within other super-sections that are to be analyzed in combination with the super-section, so as to support a consistent and accurate electro-magnetic analysis of the combined super-sections. In other types of embodiments, a mix of port types could be used provided that the same port type is used at locations common to more than one super-section. In other words, a port in a specific location in the overall electrical circuit would be the same type of port in each super-section, but different types of ports could be used within any given super-section upon defining an appropriate circuit parameter matrix.

Each series-shunt port is preferred to connect to a global (perfect) ground 438. A series-shunt port can achieve substantial isolation when connected to a non-global ground, but connection to a global ground can further realize and enhance substantial isolation of the port. Hence, a global ground potential exists at ground 438 to which all series-shunt isolation ports are connected.

In combination with use of the S parameter electromagnetic analysis method, a series shunt port has particularly high isolation properties when terminated with a resistive load, such as when terminated with a resistive load equal to the normalizing characteristic impedance (typically 50 ohms). Furthermore, the series-shunt port enables electrical stimulation, such as an incident wave, to be supplied into a super-section via the first shunt 436 of a series-shunt isolating port 430 without compromising the effectiveness of the isolating function of the first series-shunt isolating port 430

The FIGS. 4B-4C each illustrate a side perspective view of a gap isolation port and a side perspective view of a shunt isolation port respectively, and are later discussed in association with FIGS. 8 and 9 respectively.

In accordance with the invention, to determine an electromagnetic coupling associated with one or more nominal ports that are located within the electrical circuit 100, a plurality of one or more super-sections are defined to collectively include the one or more nominal ports. The location of each of the one or more nominal ports is distributed among the plurality of super-sections so that zero, one or more nominal ports are located within each super-section. Also, zero, one or more sampling ports, of which some are required to function as isolating ports to sufficiently isolate each super-section, are located within each super-section.

An electromagnetic analysis of each isolated super-section is performed to determine the electromagnetic couplings associated with and between the nominal and sampling ports that are located within each super-section. Typically, electromagnetic coupling is determined between pairs of ports, of the nominal and/or the sampling type, that are located within each super-section.

To practice the invention, an entire electrical circuit 100 need not be electromagnetically analyzed. In one type of embodiment of the invention, an electromagnetic analysis can be performed on one and only one distinct super-section without combining the results of the distinct super-section with the results of any other super section, providing that the one distinct super-section is appropriately isolated.

In accordance with the invention, the distinct super-section is appropriately isolated by including isolation sampling ports located proximate to and preferably adjacent to the intersection of a portion of the perimeter of the distinct super-section and any conductor that is located within the perimeter of the distinct super-section.

Perimeter ports are ports that are located along a portion of any conductor that is located within the perimeter and that intersects a portion of the perimeter of the distinct super-section, and that are located most proximate to the portion of the perimeter of the super-section as compared to other ports located along the same conductor. Perimeter ports may function as nominal or sampling types of ports. Interior ports are non-perimeter ports that are located within a super-section. Interior ports may function as nominal or sampling types of ports.

Optionally, the distinct super-section may also include one or more interior sampling ports that are typically located substantially inside and away from the perimeter of the distinct super-section. The interior sampling ports are located at or adjacent to an intersection of a perimeter of one or more sections and any portion of a conductor that is located within the distinct super-section. Typically, the interior sampling ports can increase the accuracy of the results of the electromagnetic analysis of the distinct super-section.

Preferably, in some embodiments, ports located within a super-section are implemented as series-shunt ports. An advantage of this type of embodiment is that electrical stimulation can be supplied into a super-section via the first shunt 436 of a series-shunt isolating port 430 while the second shunt 437 of the series-shunt isolating port 430 simultaneously maintains the effectiveness of the isolating function of the series-shunt isolating port 430.

The results of the electromagnetic analysis of the distinct super-section yields the determination of electromagnetic coupling values associated with and between any nominal and/or sampling ports located within the distinct super-section. The electromagnetic coupling values are determined as a result of electromagnetic fields generated by a portion of the electrical circuit 100 that resides within the distinct super-section. The electromagnetic coupling values do not include the effects of electromagnetic fields generated by a portion of the electrical circuit 100 residing outside of the distinct super-section.

Figure 10A:
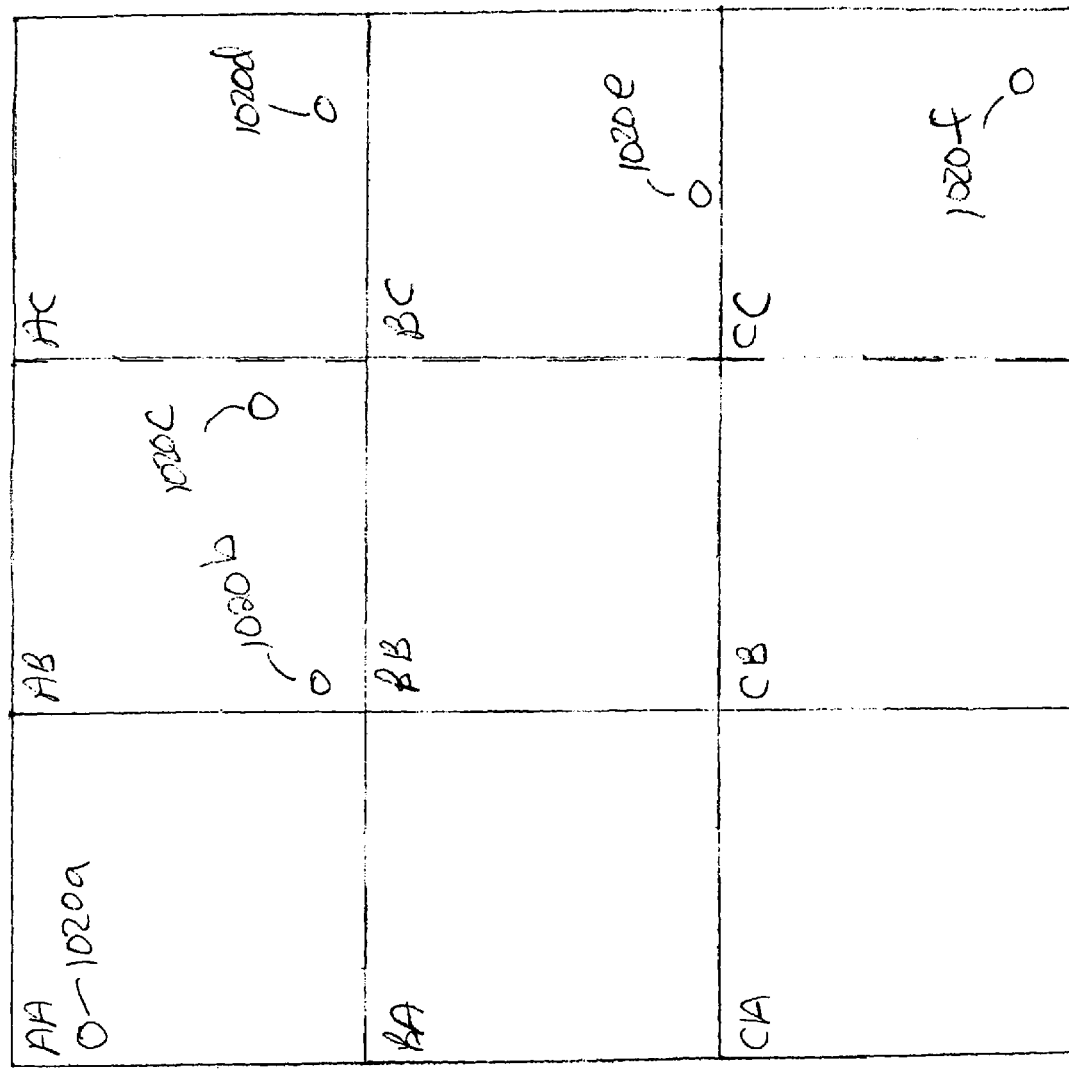
FIG. 10A illustrates the matrix like arrangement of 9 abutting and non-overlapping super-sections located on a two dimensional planar circuit.

In another type of embodiment, the above described embodiment that is applied to a distinct super-section can be instead applied to multiple distinct and non-overlapping super-sections (See FIG. 10A). The results of the electromagnetic analysis for each distinct super-section does not include the effects of electromagnetic fields generated by a portion of the electrical circuit 100 residing outside of each respective and distinct super-section. Optionally, zero, one or more pairings of distinct super-sections can be defined and located adjacent to (abutting) each other.

In yet another type of embodiment, an electromagnetic analysis can be performed on multiple distinct and overlapping super-sections. The results of each distinct and overlapping super-section are combined into a combined result. In accordance with the invention and like the above described embodiments, each distinct and overlapping super-section is isolated by including isolation sampling ports located proximate to the intersection of a perimeter of each distinct and overlapping super-section and any portion of a conductor that is located within the each distinct and overlapping super-section.

Like the embodiment applying electromagnetic analysis to a distinct super-section, the results of this type of electromagnetic analysis yields electromagnetic coupling values associated with and between nominal and/or sampling ports located within each distinct and overlapping super-section. The electromagnetic coupling values are determined as a result of electro-magnetic fields generated by a portion of the electrical circuit 100 residing within each respective and distinct overlapping super-section.

Unlike the embodiment applying electromagnetic analysis to a distinct super-section, the results from each distinct and overlapping super-section can be combined to yield combined results of multiple distinct and overlapping super-sections.

The combined results of electromagnetic analysis applied to multiple distinct and overlapping super-sections yields electromagnetic coupling values that factor the effect of electro-magnetic fields generated by a portion of the electrical circuit 100 residing outside of each respective and distinct and overlapping super-section. Consequently, these electromagnetic coupling values are typically more accurate with respect to actual electromagnetic coupling values of the entire electrical circuit 100. Consequently, this is the preferred embodiment of the invention.

Like the embodiment applying electromagnetic analysis to a distinct super-section, in accordance with the invention, each distinct and over-lapping super-section is isolated by including isolation sampling ports located proximate to the intersection of the perimeter of each distinct and overlapping super-section and any portion of a conductor located within each respective distinct and over-lapping super-section.

The accuracy of the combined results of multiple distinct and overlapping super-sections is dependent upon the consistency of the electromagnetic analysis of each of the multiple distinct and overlapping super-sections. In pursuit of a consistent electromagnetic analysis of each of the distinct and overlapping super-sections, a consistent ground potential is preferably provided to each and every port within each and every distinct and over-lapping super-section, during the electromagnetic analysis (simulation of the electro-magnetic behavior of the portion of the electrical circuit) of each and every super-section. More preferably, the consistent ground potential is also a global ground potential.

Often, an electrical circuit does not provide a global ground potential, nor a consistent ground potential, to all circuit locations (potential port locations) located within it. Likewise, a microwave circuit is typically designed to provide access to different ground potentials from various circuit locations within it. The lowest ground potential of an electrical circuit is often referred to as an "absolute" or "global" ground potential of the circuit. The different ground potentials within the circuit that are not equal to a global ground potential are often referred to as "local" ground potentials. Each local ground potential is associated with a particular location ("locale") within the electrical circuit.

A general local ground (GLG) deembedding technique is described in the document titled "Deembedding the Effect of a Local Ground Plane in Electromagnetic Analysis" published as Volume 53, No. 2 of IEEE Transactions on Microwave Theory and Techniques dated February 2005. A copy of this publication is hereby incorporated by reference in its entirety.

The GLG deembedding technique, also referred to as the GLGD technique, is employed to provide a particular ground potential to one or more locations within a representation of an electrical circuit while undergoing an electromagnetic analysis. Using GLG deembedding, a consistent ground potential and optionally a global ground potential, can be provided to each and every port within each and every super-section undergoing electro-magnetic analysis. As a result, the consistency and resulting accuracy of the electro-magnetic analysis of each super-section and of the combined results of multiple distinct and overlapping super-sections, is further realized.

The GLGD technique characterizes the effect of a local ground potential, relative to another desired (reference)

ground potential, such as a global ground potential, at a particular circuit location. For application to the electromagnetic analysis of a super-section, the circuit location is a location of a port within a super-section. Once the effect of the local ground potential is characterized for the location of a port, the effect is removed using an appropriate local ground potential effect removal technique. What remains is the effect of a desired (reference) ground potential at the location of the port.

One local ground potential effect removal technique represents the local ground potential effect using cascading matrix of (ABCD) parameters which is inverted to yield a de-embedding adapter cascading matrix. The de-embedding adapter cascading matrix is multiplied by the cascading matrix of (ABCD) parameters to eliminate the local ground potential effect upon the circuit location of the port within a super-section.

Depending on the circumstances associated with the circuit and the local ground potential, one or more supplemental port(s) maybe added to provide the cascading matrices with an even number of elements to accommodate their multiplication, and/or double ports may be added and/or a physical attachment from the local to global ground may be added to circumvent problems associated with poorly conditioned cascading matrix parameters. In some circumstances, the physical attachment can function to avoid creating a short circuit to ground.

The GLGD technique functions to effectively provide a conductive bridge from a desired ground potential accessible to a location within the electrical circuit to any port within a super-section undergoing electro-magnetic analysis. The GLGD technique further accommodates the consistent and accurate electromagnetic analysis of one or more distinct and/or over-lapping super-sections.

Figure 5A:
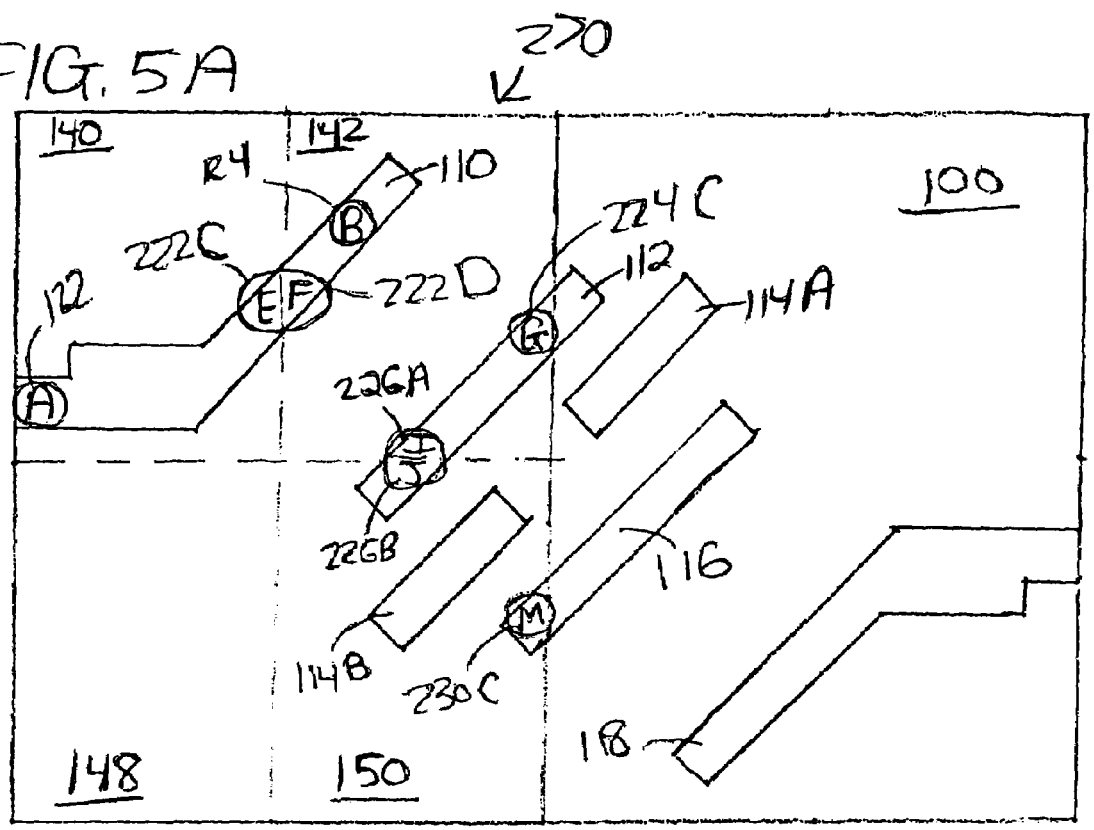
FIG. 5A illustrates the circuit representation of FIG. 3B as super-imposed with markings defining a first super-section 270.
Figure 5B:
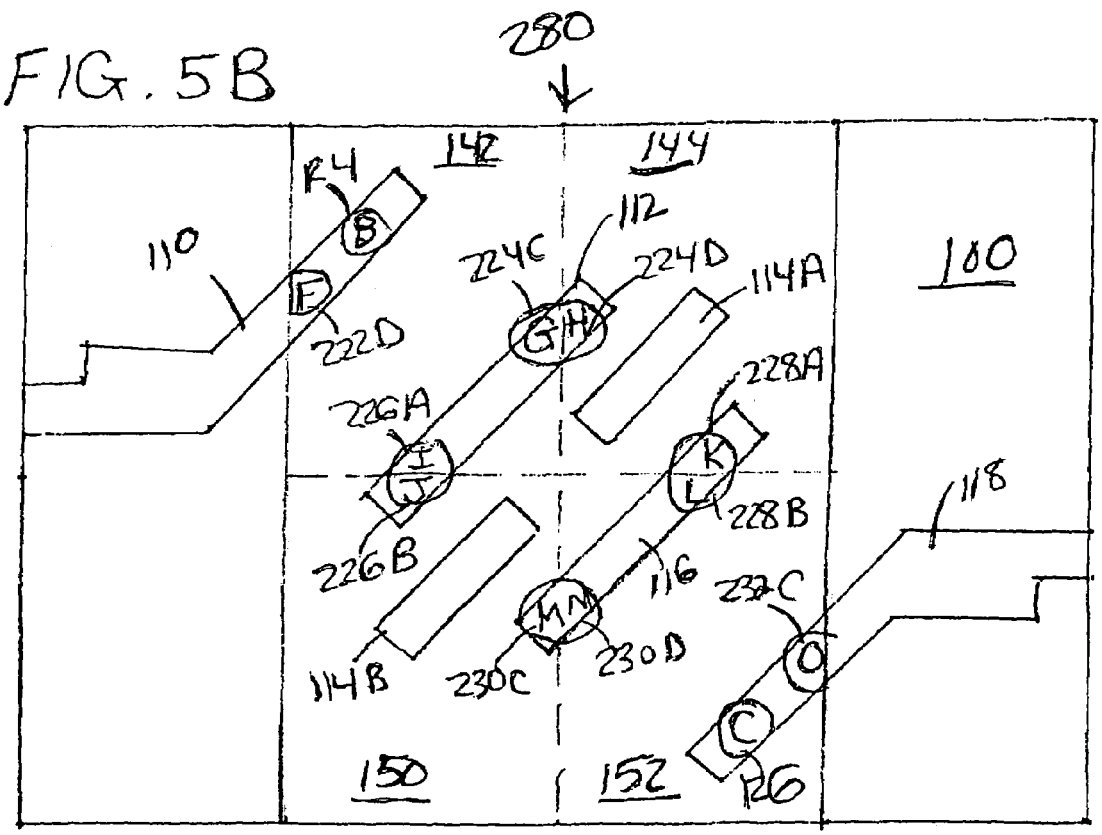
FIG. 5B illustrates the circuit representation of FIG. 3B as super-imposed with markings defining a second super-section 280.
Figure 5C:
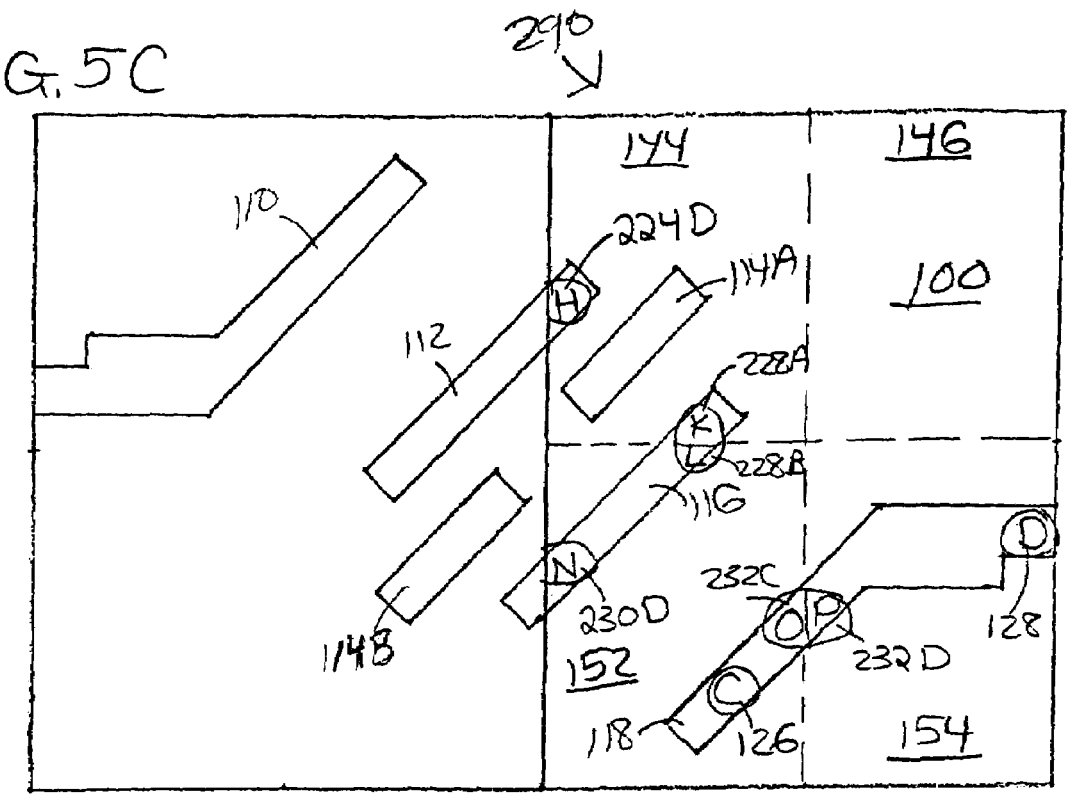
FIG. 5C illustrates the circuit representation of FIG. 3B as super-imposed with markings defining a third super-section 290.

As shown in FIGS. 5A-5C, a plurality of super-sections are defined such that the union of the super-sections includes the entire electrical circuit 100. An electromagnetic analysis method is applied to each defined super-section and the results of which are combined into a combined result in order to analyze the electromagnetic characteristics of the union of the super-sections, being as shown, the entire electrical circuit 100. To practice the invention, the union of super-sections does not need to cover the entire electrical circuit 100 and the combined result can be limited to analyzing the electromagnetic characteristics of the union of the super-sections, being only a portion of the electrical circuit 100.

FIG. 5A illustrates the circuit representation of FIG. 2B as super-imposed with markings defining a first super-section 270. A super-section is defined as an electromagnetically isolated portion of the electrical circuit 100 including one or more of the sections 140-154. The first super-section includes the portions of the electrical circuit 100 defined by the union (grouping) of sections 140, 142, 148 and 150 of FIG. 2A and excludes the portions of the electrical circuit 100 defined by the sections 144, 146, 152 or 154 of FIG. 2A.

Electromagnetic isolation of each defined super-section is a prerequisite to performing an electromagnetic analysis upon that super-section. Electromagnetic analysis of each super-section yields electromagnetic coupling information associated with and between the nominal and sampling ports located within that super-section. For example, the nominal ports 122 and 124 are both located within the first super-section 270. As a result, an electromagnetic analysis of super-section 270 yields the electromagnetic coupling associated with and between the nominal ports 122 and 124. This includes electromagnetic coupling effects between nominal port 122 and itself, between nominal port 124 and itself, from nominal port 122 to nominal port 124 and from nominal port 124 to nominal port 122.

A subset of the sampling ports, namely sampling ports (G) 224C and (M) 230C that are located within and adjacent to the perimeter of the first super-section 270, function as isolating ports. An isolating port is configured to provide substantial electromagnetic isolation between an associated super-section and any remaining portion of an electrical circuit that is located outside of the associated super-section. Isolating ports prevent the flow of current between the super-section 270 and the remainder of the electrical circuit 100. Further, the analysis of the first super-section 270 ignores the electromagnetic field effects between the super-section 270 and the remainder of the electrical circuit 100.

The sampling ports (E) 222C, (F) 222D, (I) 226A and (J) 226B are interior sampling ports that function to isolate individual sections (not the super-section) located within the first super-section 270. These sampling ports prevent the flow of current between the each section and any other section within the electrical circuit 100. But unlike isolation ports, the analysis of each super-section recognizes and does not ignore the effects of electromagnetic fields located between sections located within the first super-section 270.

As shown, an isolating port (G) 224C is incorporated into the electrical circuit 100 at a location where the conductor 112 intersects the perimeter of the first super-section 270. The isolation sampling port (G) replaces the sampling port 224 of FIG. 2B. An isolating sampling port (M) 230C is incorporated into the electrical circuit 100 at a location where the conductor 116 intersects the perimeter of the first super-section 270. The isolation port (M) replaces the sampling port 230 of FIG. 2B.

Optionally, a nominal port can also function as an isolating port. For example, the nominal port (A) 122 can function to isolate the first super-section 270. Hence, the incorporation of an isolating port at the location of nominal port (A) is not required for appropriate electromagnetic isolation the first super-section 270. Further, if nominal port (A) is located at the edge of the entire circuit, there is not circuit activity located on the opposite side of the edge to isolate.

Notice that all ports located along the perimeter of the first super-section 270 are either nominal or isolating ports. The perimeter of the first super-section 270 is electrically connected to one ground potential so that electro-magnetic coupling values can be consistently determined with respect to the same one ground potential.

FIG. 5B illustrates the circuit representation of FIG. 2B as super-imposed with markings defining a second super-section 280. The second super-section 280 includes the portions of the electrical circuit 100 defined by the union (grouping) of sections 142, 144, 150 and 152 of FIG. 2A and excludes the portions of the electrical circuit 100 defined by the sections 140, 146, 148 and 154 of FIG. 2A.

Electromagnetic analysis of each super-section yields electromagnetic coupling information associated with and between the nominal and sampling ports located within that super-section. For example, the nominal ports 124 and 126 are both located within the second super-section 280. As a result, an electromagnetic analysis of super-section 280 yields the electromagnetic coupling associated with and between the nominal ports 124 and 126. This includes electromagnetic coupling effects between nominal port 124 and itself, between nominal port 126 and itself, from nominal port 124 to nominal port 126 and from nominal port 126 to nominal port 124.

A subset of the sampling ports, namely sampling ports (F) 222D and (O) 232C that are located within and adjacent to the perimeter of the second super-section 280, function as isolating ports for the second super-section. An isolating port is configured to provide substantial electromagnetic isolation between an associated super-section and any remaining portion of an electrical circuit that is located outside of the associated super-section. Isolating ports 222D, 232C prevent the flow of current between the super-section 280 and the remainder of the electrical circuit 100. Further, the analysis of the second super-section 280 ignores the electromagnetic field effects between the second super-section 280 and the remainder of the electrical circuit 100.

The sampling ports (G), (H), (I), (J), (K), (L), (M) and (N) are interior sampling ports that function to isolate individual sections (not the super-section) located within the second super-section 280. These sampling ports prevent the flow of current between the each section and any other section within the electrical circuit 100. But unlike isolation ports, the analysis of each super-section recognizes and does not ignore the electromagnetic field effects between sections located within the second super-section 280.

As shown, an isolating port (F) 222D is incorporated into the electrical circuit 100 at a location where the conductor 1 0 intersects the perimeter of the super-section 280. The isolating sampling port (F) replaces the sampling port 222 of FIG. 2B. An isolating sampling port (O) 232C is incorporated into the electrical circuit 100 at a location where the conductor 118 intersects the perimeter of the super-section 280. The isolation port (O) replaces the sampling port 232 of FIG. 2B.

Notice that all ports located along the perimeter of the super-section 280 are isolating ports. The perimeter of the super-section 280 is electrically connected to one ground potential so that electro-magnetic coupling values can be consistently determined with respect to the same one ground potential.

Unlike the embodiment applying electromagnetic analysis to a distinct super-section, a first sampling port, having a first location, that is required in one super-section and is also required in another overlapping super-section that includes the same first location of the first sampling port. Typically, a first isolating sampling port of a first distinct and over-lapping super-section is analyzed as a second interior sampling port of a second distinct and over-lapping super-section and vice versa.

For example, sampling port (G) of the super-section of FIG. 5A functions as an isolating port within the first super-section of FIG. 5A, but also functions as an interior sampling port within the second super-section of FIG. 5B. Also, sampling port (F) of the second super-section of FIG. 5B functions as an isolating port within the second super-section of FIG. 5B, but also functions as an interior sampling port within the first super-section of FIG. 5A.

Unlike the embodiment applying electromagnetic analysis to a distinct super-section, the interior sampling port (G) located within the second super-section of FIG. 5B is not optional if the results of the second super-section are to be combined with the results of the first super-section. For the same reasons, the interior sampling port (F) located within the first super-section of FIG. 5A is not optional, if the results of the first super-section are to be combined with the results of the second super-section.

Accordingly, because an isolating port is required to be located within a first super-section, it is also required to be located within other super-sections that are being combined with the first super-section, even if the first isolating port does not function as an isolating port within the other super-sections.

FIG. 5C illustrates the circuit representation of FIG. 2B as super-imposed with markings defining a third super-section 290. The third super-section includes the portions of the electrical circuit 100 defined by the union (grouping) of sections 144, 146, 152 and 154 of FIG. 2A and excludes the portions of the electrical circuit 100 defined by the sections 140, 142, 148 and 150 of FIG. 2A.

Electromagnetic analysis of each super-section yields electromagnetic coupling information associated with and between the nominal and sampling ports located within that super-section. For example, the nominal ports (C) 126 and (D) 128 are both located within the third super-section 290. As a result, an electromagnetic analysis of super-section 290 yields the electromagnetic coupling associated with and between the nominal ports 126 and 128. This includes electromagnetic coupling effects between nominal port 126 and itself, between nominal port 128 and itself, from nominal port 126 to nominal port 128 and from nominal port 128 to nominal port 126.

A subset of the sampling ports, namely sampling ports (H) 224D and (N) 230D that are located within and adjacent to the perimeter of the third super-section 290, function as isolating ports. An isolating port is configured to provide substantial electromagnetic isolation between an associated super-section and any remaining portion of an electrical circuit that is located outside of the associated super-section. Isolating ports prevent the flow of current between the super-section 290 and the remainder of the electrical circuit 100. Further, the analysis of the third super-section 290 ignores the electromagnetic field effects between the third super-section 290 and the remainder of the electrical circuit 100.

The sampling ports (K) 228A, (L) 228B, (O) 232C and (P) 232D are interior sampling ports that function to isolate individual sections (not the super-section) located within the third super-section 290. These sampling ports prevent the flow of current between each section and any other section within the electrical circuit 100. But unlike isolation ports, the analysis of each super-section (third super-section 290) recognizes and does not ignore the effects of electromagnetic fields located between sections located within the third super-section 290.

As shown, an isolating port (H) 224D is incorporated into the electrical circuit 100 at a location where the conductor 112 intersects the perimeter of the third super-section 290. The isolation sampling port (H) replaces the sampling port 224 of FIG. 2B. An isolating sampling port (N) 230D is incorporated into the electrical circuit 100 at a location where the conductor 116 intersects the perimeter of the third super-section 290. The isolation port (N) replaces the sampling port 230 of FIG. 2B.

Optionally, a nominal port can also function as an isolating port. For example, the nominal port (D) 128 can function to isolate the third super-section 290. Hence, the incorporation of an isolating port at the location of nominal port (D) is not required for appropriate electromagnetic isolation the third super-section 290. Further, if nominal port (D) is located at the edge of the entire circuit 100, there is no circuit activity located on the opposite side of the edge to isolate.

Notice that all ports located along the perimeter of the third super-section 290 are either nominal or isolating ports. The perimeter of the third super-section 290 is electrically connected to one ground potential so that electro-magnetic coupling values can be consistently determined with respect to the same one ground potential. The same one ground potential is also equal to the ground potential of the other super-sections, namely super-sections 270 and 280, so that the results of the electromagnetic analysis of all three super sections 270, 280, 290 can be accurately combined. All of the above described embodiments require that each super-section have substantial electromagnetic isolation from any portion of the electrical circuit that is located outside of the super-section. Substantial isolation includes isolation from the flow of electrical current and from the effect of electromagnetic fields located in any portion of the electrical circuit that is located outside of the super-section.

What is required to achieve substantial isolation of a super-section depends upon the type of electromagnetic analysis being performed upon the super-section. Certain types of isolating sampling ports provide substantial isolation in combination with a specific type of electromagnetic analysis. Further, each type of isolating sampling port may require electrical connection to a specific type of ground potential in order to provide substantial isolation to a super-section during electromagnetic analysis of the super-section.

For embodiments using scattering (S) parameter electromagnetic analysis of a super-section, use of series-shunt isolation ports that are located adjacent to or proximate to either or both opposite sides of the perimeter of a section or super-section and that are connected to a global ground potential provide substantial electromagnetic isolation.

Preferably, each shunt of the pair of shunts of a series shunt port is located adjacent to respectively each of the opposite sides of a section and/or super-section perimeter. In this circumstance, the entire series shunt port is said to be located on, over or stratteling a section and/or super-section perimeter.

For embodiments using Y parameter electromagnetic analysis of a super-section, use of shunt isolation ports that are located proximate to and inside of the perimeter of the super-section and that are connected to a consistent ground potential provide substantial electromagnetic isolation for the super-section under certain circumstances. Preferably, the shunt isolation ports are connected to a consistent and global ground potential.

For embodiments using Z parameter electromagnetic analysis of a super-section, use of gap isolation ports that are located proximate to and inside of the perimeter of the super-section can provide substantial electromagnetic isolation for the super-section under certain circumstances.

In one embodiment, at least a portion of perimeter of a super-section is located along a portion of the electrical circuit that is connected to a global ground, for example, such as a side wall of the electrical circuit that is connected to a global ground. In another embodiment, a super-section is isolated by simulating the presence of a side wall along its perimeter.

In another embodiment, a sampling port located within a super-section that is located away from a location of a global or a consistent ground potential, is provided a connection to the global ground or consistent ground potential via an algorithm (technique) referred to as general local ground (GLG) de-embedding.

Generally, the type of sampling port, for example a shunt or series-shunt sampling port, and its associated ground potential, is preferred to be consistent with the type of the other ports that are located within each super-section that includes it. For example, if the first super-section of FIG. 5A and the second super-section of FIG. 5B each use series-shunt sampling ports having a perfect global ground connection, then ports (G) and (F) located within both the first and second super-sections, are preferred to also be a series-shunt type of sampling port having the same perfect ground connection to support consistent electromagnetic analysis of the first and second super-section and for combination of the results from the electromagnetic analysis of the first and second super-section.

Optionally, each distinct and overlapping super-section may also include one or more (optional) sampling ports located at the intersection of a perimeter of one or more sections and at a portion of a conductor located within the distinct super-section. The addition of one or more optional sampling ports can improve the accuracy of the results of the electromagnetic analysis of each distinct and overlapping super-section.

As a result, the electromagnetic analysis of each optional sampling port must be included within each distinct and overlapping super-section that includes the location of that optional sampling port. Also, the type of sampling port, for example the type being a gap, shunt or series-shunt sampling port, and its associated ground potential, should preferably be consistent with the type of the other ports located within each super-section that includes it. But consistency of port types within a super-section, although preferred, is not required to practice the invention.

In many circumstances, it is preferable to define overlapping super-sections to effectively determine electromagnetic couplings between a first and a second port, of the nominal or sampling type, that are located within a range of proximity to each other.

Conversely, when not using overlapping super-sections, the first and the second port that are located proximate to each other may be located in distinct and non-overlapping super-sections, such as a distinct and non-overlapping first and second super-section. Consequently, no one electromagnetic analysis will be performed upon any super section including both the first and second ports, and no electromagnetic coupling between the first and the second ports will be determined from the electromagnetic analysis of either the first or second super-section or of both the first and second super-sections.

But if super-sections are defined to overlap such that the first and the second port are both located within at least one third super-section that is defined to overlap the first and the second super-section and includes each of the first and second ports, then an electromagnetic analysis will be performed upon the at least one third super section that includes both the first and the second ports, and the electromagnetic coupling between the first and the second port will be determined from the electromagnetic analysis of the at least one third super-section.

Figure 7A:
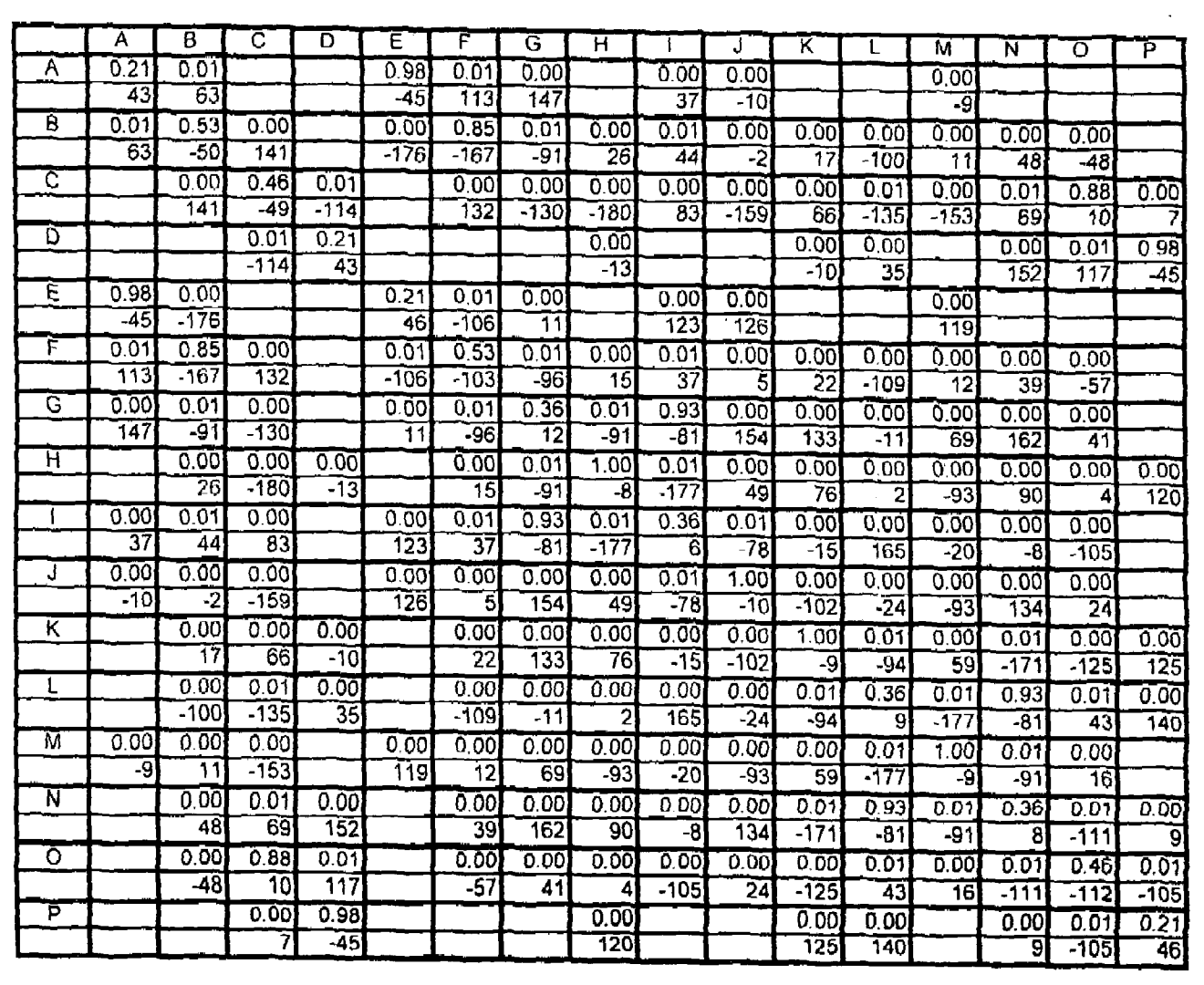

As shown in FIG. 7A, the results of the electromagnetic analysis performed for the each of the overlapping super-sections of FIGS. 5A-5C are collectively combined. The results yield a determination of the electromagnetic coupling (s) associated with ports of interest that are collectively located within the union of the super-sections of FIGS. 5A-5C.

To determine a first electromagnetic coupling associated with only one first port, both an electrical stimulus is applied to, and an electrical response is determined from, the same one first port. To determine a second electromagnetic coupling associated with only one second port, both an electrical stimulus is applied to, and an electrical response is determined from, the same one second port.

To determine third electromagnetic coupling associated with a pair of ports including the first and the second port, an electrical stimulus is applied to the first port of the pair and an electrical response is determined from a second port of the pair, and an electrical stimulus is applied to the second port of the pair and an electrical response is determined from the first port of the pair. Determining an electromagnetic coupling associated with and between the first and second ports includes the first, second and third electromagnetic couplings.

The invention is not limited with respect to the type of electromagnetic analysis selected to be performed upon each of one or more super-sections. Neither is the invention limited with respect to the types of (electromagnetic) isolation methods selected to be performed upon each of the one or more super-sections.

In accordance with the invention, one can select an electromagnetic analysis method, from a variety of types of electromagnetic analysis methods, to perform upon a particular (electromagnetically) isolated super-section. Also in accordance with the invention, as a prerequisite to performing electromagnetic analysis of a particular super-section, one can select an appropriate isolation method, from a variety of types of isolation methods, to perform upon a super-section.

Preferably, an appropriate (electromagnetic) isolation method is performed upon a super-section in accordance with the type of electromagnetic analysis performed upon the same super-section. An appropriate (electromagnetic) isolation method provides substantial electromagnetic isolation between an associated super-section and any remaining portion of the electrical circuit 100 that is located outside of the associated super-section. Preferably, an electromagnetic isolation method provides maximum available isolation with respect to the particular type of electromagnetic analysis being performed.

For example, the variety of types of electromagnetic analysis methods include, but are not limited to, methods whose final results are expressed in terms of impedance (Z) parameters, admittance (Y) parameters, scattering (S) parameters and methods using a type of reduced order model. Also for example, the variety of types of isolation methods include, but are not limited to isolation methods incorporating one or more series (gap) isolation ports, incorporating one or more shunt isolation ports or incorporating one or more series shunt isolation ports into a super-section portion of a representation of an electrical circuit structure. Actually, different types of electromagnetic (EM) analysis methods can produce S, Y, or Z parameters, or reduced order models. Examples of different types of EM analysis methods include Method of Moments (MoM), Finite Elements, Finite Difference Time Domain (FDTD), Finite Integration Technique (FIT), and Partial Element Equivalent Circuit (PEEC). Each one of these methods can produce these different types of circuit parameter outputs and can be incorporated into embodiments of the invention that perform EM analysis of one or more super-sections. For example, in one type of embodiment, the invention incorporates the Method of Moments for the EM analysis of one or more super-sections.

Depending upon the selected (electromagnetic) analysis method, one or more particular types of (electromagnetic) isolation methods may not provide maximum, or even substantial electromagnetic isolation between an associated super-section and any remaining portion of the electrical circuit that is located outside of the associated super-section. Consequently, those one or more particular types of (electromagnetic) isolation methods are inappropriate in combination with a particular type of electromagnetic analysis method. For the same reasons, one or more particular types of electromagnetic analysis methods are inappropriate in combination with particular (electromagnetic) isolation methods.

Preferably, one electromagnetic analysis method is selected and performed upon each and every one of one or more super-sections defined for an electrical circuit structure. And preferably, as a prerequisite to performing electromagnetic analysis, one appropriate isolation method is selected and performed upon the each and every one of one or more super-sections defined for the electrical circuit structure in accordance with the selected and performed electromagnetic analysis method.

In some embodiments, an electromagnetic analysis method is performed using scattering (S) parameters. Using this method, a traveling electrical wave is applied to a first port of interest and an outgoing traveling wave is measured at a second port of interest while the super-section is isolated from the remainder of the electrical circuit by placing all other ports into an isolated state. For this type of embodiment electromagnetic analysis method, an isolation method incorporating one or more series-shunt isolation ports is appropriate.

In some embodiments, an electromagnetic analysis method is performed using impedance (Z) parameters. Using this method, a current is supplied into a first port of interest and an open circuit voltage is measured at a second port of interest while the super-section is isolated from the remainder of the electrical circuit by placing all other ports into an isolated state. For this type of embodiment electromagnetic analysis method, an isolation method incorporating one or more series (gap) isolation ports is appropriate.

In some embodiments, an electromagnetic analysis method is performed using admittance (Y) parameters. Using this method, a voltage is supplied into a first port of interest and a short circuit current is measured at a second port of interest while the super-section is isolated from the remainder of the electrical circuit by placing all other ports into an isolated state. For this type of embodiment electromagnetic analysis method, an isolation method incorporating one or more shunt isolation ports is appropriate.

FIG. 6A is a matrix illustrating electromagnetic coupling values determined as a result of the electromagnetic analysis of the first super-section. Each element of the matrix is located within, and at an intersection of, the one row and the one column of the matrix. Each row and each column of the matrix includes a one-dimensional array of elements. Each element of the array of elements stores one or more values, also referred to as electromagnetic coupling value(s), representing a determination of an electromagnetic coupling associated with at least one port. The electromagnetic coupling is determined from an electromagnetic analysis of at least a portion of the circuit representation 100.

As shown, the matrix has 16 rows and 16 columns and 256 elements. Each row represents one of the ports (A-P), and each column represents one of the ports (A-P), as shown in FIG. 4C. With respect to a particular element of the matrix, a "row port" is a port that is associated with the one row that intersects the element. Likewise, a "column port" is a port that is associated with the one column that intersects the element.

Hence, the electromagnetic coupling value(s) stored within an element represent a determination of an electromagnetic coupling associated with the combination of the row port and the column port associated with and that intersect at the location of the element. If the row port and the column port are the same port, then the electromagnetic coupling value(s) stored within the element represent the electromagnetic coupling between the port and itself.

The matrix includes a value set of one or more value(s) representing the electromagnetic coupling associated with ports, namely the nominal ports (A, B) and the sampling ports (E, F, G, I, J, M), that are located within the first super-section (FIG. 5A). The electro-magnetic coupling values associated with ports that are not located within the first super-section, namely the nominal ports (C, D) and the sampling ports (H, K, L, N, O, P), are not determined from the electromagnetic analysis of the first super-section and are not stored within this matrix.

Elements representing the electromagnetic coupling values associated with ports that are not located within the first super-section are empty. An empty element indicates that any associated electromagnetic coupling value(s) are not applicable to the electro-magnetic analysis of the first super-section. Mathematically, empty elements within a matrix are processed as being equivalent to having a value of zero.

As shown, each electromagnetic coupling value is represented by an S-parameter. An S-parameter is represented by a value set including a magnitude value and an angle value, expressing a complex number. For example, the value set representing the electromagnetic coupling associated with and between nominal port (A) and sampling port (E) is equal to a magnitude value of 0.98 and an angle value of −45 degrees. On the other hand, the value set representing the electromagnetic coupling associated with and between sampling port (F) and sampling port (M) is equal to a magnitude value of 0.00. All values are rounded off. More precision would show 0.00 is actually a very small number, not exactly zero. The angle value has no significance for a complex number with a magnitude of exactly zero. As indicated, there is substantially more electromagnetic coupling associated with and between ports (A) and (E) than associated with and between ports (F) and (M). Further, there is approximately no electromagnetic coupling between ports (F) and (M).

An electromagnetic coupling associated with only one port can also be determined. For example, the value set representing the electromagnetic coupling associated with and between nominal port (A) and itself (nominal port (A)) is equal to a magnitude value of 0.21 and an angle value 43 degrees.

Most of the elements of this matrix are empty. Of the 256 elements of this matrix, 192 elements are empty and 64 elements are non-empty. An element that is empty is mathematically processed as storing both a magnitude value and an angle value equal to 0. Because there are many empty elements, this matrix is characterized as a "sparse" matrix.

FIG. 6B is a matrix illustrating electromagnetic coupling values determined from the results of the electromagnetic analysis of the second super-section. The matrix includes value sets of one or more value(s) (S-parameters) representing the electromagnetic coupling associated with ports, namely the nominal ports (B, C) and the sampling ports (F, G, H, I, J, K, L, M, N, O), that are located within the second super-section (FIG. 5B).

The electro-magnetic coupling values associated with ports that are not located within the second super-section, namely the nominal ports (A, D) and the sampling ports (E, P), are not determined from the electromagnetic analysis of the second super-section and are not stored within this matrix. As shown, any elements that are associated with a port that is not located within the second super-section, store no value(s) and are shown as empty.

For example, the value set representing the electromagnetic coupling associated with and between nominal port (B) and sampling port (F) is equal to a magnitude value of 0.85 and an angle value of −167 degrees. On the other hand, the value set representing the electromagnetic coupling associated with and between sampling port (F) and sampling port (J) is equal to a magnitude value of 0.00 and an angle value 5 degrees.

As indicated, there is substantially more electromagnetic coupling between ports (B) and (F) than between ports (F) and (J). Further, there is approximately no electromagnetic coupling between ports (F) and (J). The electromagnetic coupling associated with and between nominal port (C) and itself (nominal port (C)) is equal to a magnitude value of 0.54 and an angle value −50 degrees.

Although more elements of this matrix are non-empty as compared to the matrix of FIG. 6A, many of the elements of this matrix are empty. Of the 256 elements of this matrix, 112 elements are empty and 144 elements are non-empty. An element that is empty is mathematically processed as storing both a magnitude value and an angle value equal to 0. Because that are many empty elements, this matrix is characterized as a "sparse" matrix.

FIG. 6C is a matrix illustrating electromagnetic coupling values determined from the results of the electromagnetic analysis of the third super-section. The matrix includes value sets of one or more value(s) (S-parameters) representing the electromagnetic coupling associated with ports, namely nominal ports (C, D) and sampling ports (H, K, L, N, O, P), that are located within the third super-section (FIG. 5C).

The electromagnetic coupling values associated with ports that are not located within the third super-section, namely nominal ports (A, B) and sampling ports (E, F, G, I, J, M), are not determined from the electromagnetic analysis of the third super-section and are not stored within this matrix. As shown, elements that are associated with at least one port that is not located within the third super-section, store no value(s) and are empty.

For example, the value set representing the electromagnetic coupling associated with and between nominal port (D) and sampling port (P) is equal to a magnitude value of 0.98 and an angle value of −45 degrees. On the other hand, the value set representing the electromagnetic coupling associated with and between sampling port (H) and sampling port (L) is equal to a magnitude value of 0.00 and an angle value 2 degrees.

As indicated, there is substantially more electromagnetic coupling between ports (D) and (P) than between ports (H) and (L). Further, there is approximately no electromagnetic coupling between ports (H) and (L). The electromagnetic coupling associated with and between nominal port (D) and itself (nominal port (D)) is equal to a magnitude value of 0.21 and an angle value 43 degrees.

Like the matrix of FIG. 6A, most of the elements of this matrix are empty. Of the 256 elements of this matrix, 192 elements are empty and 64 elements are non-empty. An element that is empty effectively indicates the absence of an electromagnetic coupling and effectively has a magnitude value and an angle value equal to 0. This matrix can be characterized as "sparse".

FIG. 7A is a matrix illustrating scattering (S) parameter electromagnetic coupling values determined from the combined results of the electromagnetic analysis of all three super-sections. This matrix represents the combined results of the electromagnetic analysis of the first, second and third super-sections as shown in FIGS. 6A-6C.

Notice that there are multiple electromagnetic coupling values for ports that are located within more than one super-section. For example, the nominal port (B) and sampling ports (F, G, I, J, M) are located within both the first and the second super-sections. Consequently, there are separate electromagnetic coupling values associated with nominal port (B) and sampling ports (F, G, I, J, M) as a result of the separate electromagnetic analyses of both the first and the second super-sections.

Also, the nominal port (C) and sampling ports (H, K, L, N, O) are located within both the second and third super-sections. Consequently, there are separate electromagnetic coupling values associated with nominal port (C) and sampling ports (H, K, L, N, O) as a result of the separate electromagnetic analyses of both the second and the third super-sections. There are no ports located within both the first and the third super-sections.

In some embodiments, at least one of the values included within the combined results is determined as result of an arbitration between separate electromagnetic coupling values associated with a port that is located within more than one super-section.

In one type of embodiment of the invention, the combined results includes at least one electromagnetic coupling value that is determined as an average of separate electromagnetic coupling values. Each separate and respective electromagnetic coupling value is determined in association with the port as it is located and electro-magnetically analyzed within each one separate and respective super-section.

For example, the electromagnetic coupling associated with the sampling ports (F) and (G) resulting from the first super-section analysis has a magnitude value equal to 0.01 and an angle value of −115. But, the electromagnetic coupling associated with the sampling ports (F) and (G) resulting from the second super-section analysis has a magnitude value equal to 0.01 and an angle value of −96. For this type of embodiment, the combined results would represent the electromagnetic coupling value associated with the sampling ports (F) and (G) as a magnitude value equal to 0.01 and an angle value equal to −105.5, which can optionally be rounded up to −105 or down to −106.

In another type of embodiment of the invention, the combined results represents the electromagnetic coupling value for the union all super-sections as equal to the result that is determined when the one or more ports are located farthest from the perimeter of their respective super-section.

For example, the electromagnetic coupling associated with the sampling ports (H) and (N) resulting from the second super-section analysis has a magnitude value equal to 0.00 and an angle value of 80. But, the electromagnetic coupling associated with the sampling ports (H) and (N) resulting from the third super-section analysis has a magnitude value equal to 0.00 and an angle value of 90.

In this embodiment, the combined results represents the electromagnetic coupling value associated with the sampling ports (H) and (N) as equal to the results of the second super-section analysis, because the ports (H) and (N) are located farther from the perimeter of the second super-section than they are located from the perimeter of the third super-section. Optionally, if the one or more ports appear equally distant from the perimeter of each respective super-section, then the average of the separate coupling values can be selected, or the highest or lowest coupling value can be selected, as described above.

In another type of embodiment of the invention, the combined results represents the electromagnetic coupling value for the union all super-sections as equal to the highest or lowest electromagnetic coupling value associated with a port located within, and determined from the analysis of, each distinct and respective super-section. For example, the highest result of the coupling associated with the sampling ports (F) and (G) is a magnitude value equal to 0.01 and an angle value of −96 and the lowest result is magnitude value equal to 0.01 and an angle value of −115. The values of the highest (0.01) and lowest (0.01) result are equal.

As shown, the combined results of the electromagnetic analysis of the union of all super-sections, arbitrates different electromagnetic coupling values by selecting the highest electromagnetic coupling value determined from the electromagnetic analysis of multiple super-sections.

FIG. 7B illustrates a set of mathematical operations utilized to eliminate the effect of one or more series-shunt sampling ports. Eliminating the effects of a particular series-shunt port from a first matrix, yields a second matrix that excludes the electromagnetic coupling values associated with the particular series-shunt port and excludes the effects of the particular series-shunt port upon the electromagnetic coupling values of the ports that remain within the second matrix.

As a result, the second matrix is smaller in dimension than the first matrix and the remaining electromagnetic coupling values of the second matrix may be revised relative to those of the first matrix to represent the elimination of the effect of the removed series-shunt port. The second matrix is referred to as being "reduced" relative to the first matrix. Removing the effects of less than all of the sampling ports "partially" reduces the first matrix. Removing the effect of all sampling ports "fully" reduces the first matrix.

Furthermore, the electromagnetic coupling values associated with the nominal ports the remain within the second reduced matrix, some of which may be revised from the first matrix, have accuracy greater than or equal to those of the electromagnetic coupling values of the first matrix. In some circumstances, removing a sampling port may actually temporarily decrease the actual accuracy of a specific nominal port S-parameter until the effect of all of the other sampling ports is also removed. Upon eliminating the effect of all sampling ports within the first matrix, the most accurate electromagnetic coupling values associated with the nominal ports of the circuit representation 100 remain within a fully reduced second matrix.

Each series-shunt port includes a pair of shunt ports arranged in series. For example, the series-shunt sampling port (KL) includes a port (L) and a port (K). Eliminating the effect of the series-shunt port (KL) from a first combined estimated matrix yields a second reduced matrix excluding electromagnetic coupling values associated with the ports (L) and (K). Furthermore, the second reduced matrix includes electromagnetic coupling values associated with the nominal ports that have accuracy greater than or equal to that of the first matrix.

Referring again to FIG. 7B, the following general lexicography applies to the mathematical operations utilized for eliminating the effects of a series shunt sampling port (XY). A first matrix $S(n)(n)$ represents a matrix (Like that shown in FIG. 7A) including (n) rows and (n) columns of electromagnetic coupling values. The electromagnetic coupling values include the effects of one or more series-shunt sampling ports and consequently, the $S(n)(n)$ matrix is un-reduced, and will be alternatively referred to as $S(\text{un-reduced})(n)(n)$.

A matrix $S(\text{un-reduced}) (n-2)(n-2)$ 782 is a sub-matrix of the matrix $S(n)(n)$ that excludes two rows and two columns representing the associated electromagnetic coupling values associated with the pair of sub-ports (X and Y) of a series-shunt sampling port (XY). The electromagnetic coupling values remaining within this matrix include the effects of the one or more series-shunt sampling ports including the (XY) port and consequently, this matrix is un-reduced. Note that a sub-matrix stores a subset of the values of another matrix.

A second matrix S(reduced)(n–2)(n–2) 780 is the S(n–2)(n–2) matrix with the exception that it includes electromagnetic coupling values that exclude the electromagnetic effects of the removed series shunt sampling port (XY).

A matrix S(n–2) (2) 784 is a sub-matrix of the matrix S(n)(n) including only the two columns (X and Y) representing the electromagnetic coupling values of a series-shunt sampling port (XY). A matrix S(2) (n–2) 788 is a sub-matrix of the matrix S(n)(n) including only the two rows (X and Y) representing the electromagnetic coupling values between the (X and Y) ports and other ports, but not associated with or between the (X and Y) ports.

As shown, the matrix S(Q) 786 is a multiplier matrix of (2) rows and (2) columns that is determined from the mathematical operations performed upon the S-parameter electromagnetic coupling values of the S(un-reduced)(n)(n) matrix.

To determine S(reduced)(n–2)(n–2) 780, that is reduced with respect to one series-shunt sampling port (XY), the matrix S(2)(n–2) 788 is multiplied by the matrix S(Q) 786 to generate a first matrix product. The first matrix product is further multiplied by the matrix S(n–2) (2) 784 to generate a second matrix product. The second matrix product is added to the matrix S(un-reduced)(n–2)(n–2) 782 to generate the matrix S(reduced)(n–2)(n–2) 780. If other series-shunt sampling ports remain within the S(reduced)(n–2)(n–2) matrix, then the S(reduced)(n–2)(n–2) 780 matrix is partially reduced.

The execution of the set of mathematical operations described above constitutes an (one) iteration of a procedure that sequentially eliminates the effects of one or more series-shunt sampling ports, at the rate of one series-shunt sampling port per iteration.

Further, the set of mathematical operations described above are applied to each non-fully reduced matrix S(reduced)(n–2)(n–2) 780 to further reduce and to sequentially eliminate the effects of each of the other remaining series-shunt sampling ports. Upon eliminating the effects of all series-shunt sampling ports, the finally generated S(reduced)(n–2)(n–2) 780 matrix is fully reduced and includes only electromagnetic coupling values that are free of the effects of any series-shunt sampling port and that are associated with the nominal ports of the circuit representation 100.

Figure 7C:
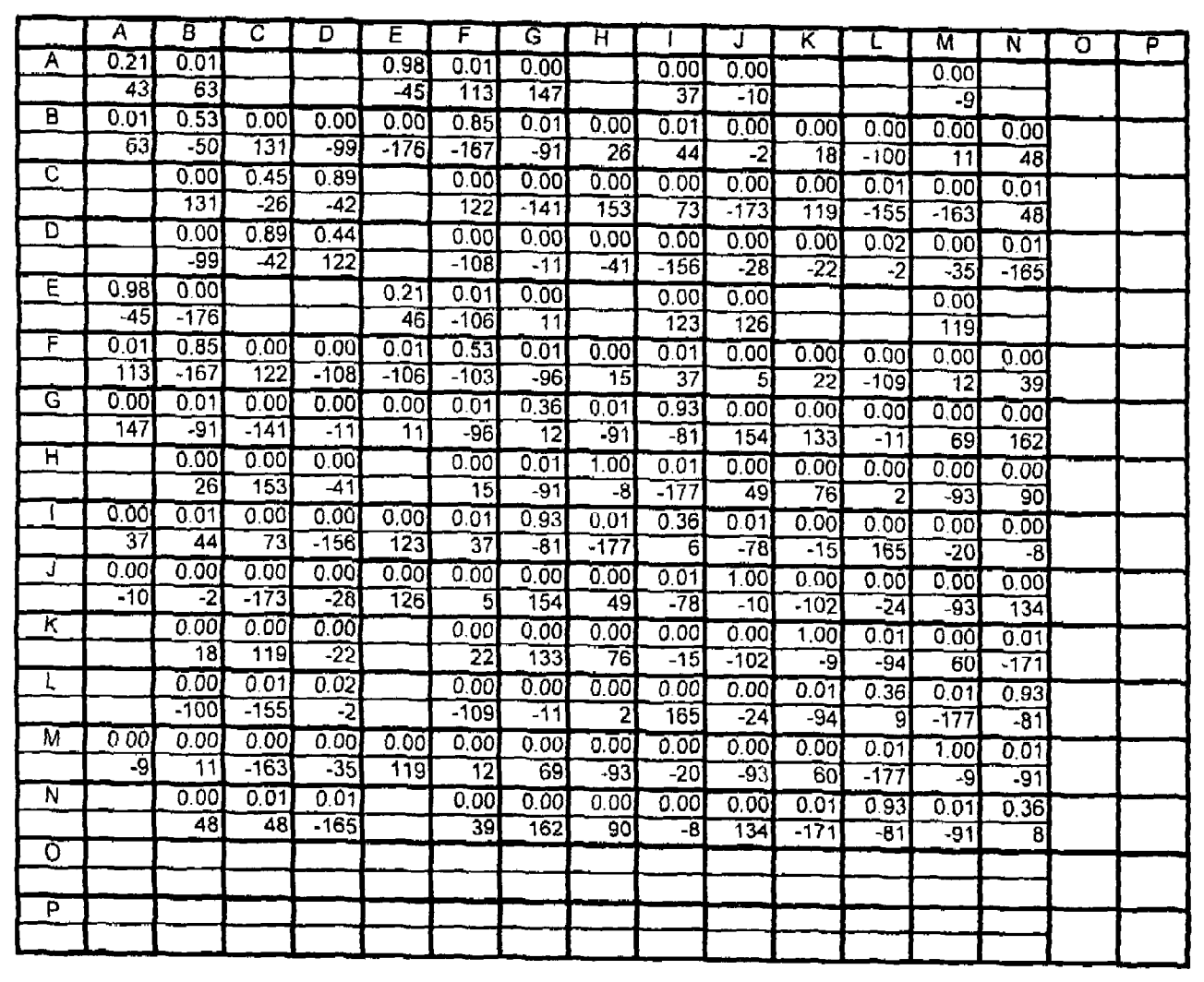

FIG. 7C illustrates a partially reduced matrix that is transformed from the un-reduced matrix of FIG. 7A. This matrix stores electromagnetic coupling values that exclude electromagnetic coupling values associated with the (OP) series-shunt sampling port and that exclude the effects of the (OP) series-shunt sampling port upon other ports.

As an example, the S(n)(n) matrix of FIG. 7A is partially reduced by eliminating the effect of the series-shunt port (OP). The series-shunt port (OP) includes the two sub-ports (O) and (P). A matrix S(un-reduced) (n–2)(n–2) 782 is generated by removing the two rows and the two columns from the first S(n)(n) matrix that include electromagnetic coupling values associated with the sampling ports (O) and (P) of the series-sampling port (OP). The electromagnetic coupling values remaining within the S(un-reduced) (n–2)(n–2) 782 matrix still include the effects of the one or more series-shunt sampling ports, including the (OP) sampling port and remains un-reduced.

A matrix S(n–2) (2) 784 is a sub-matrix of the matrix S(n)(n) that has only (n–2) rows and (2) columns. It is constructed from the two columns (O and P) of the S(n)(n) matrix representing the electromagnetic coupling values of the series-shunt sampling sub-ports (O and P). Note that both of the two columns (O and P) exclude two elements located within the rows (O and P). A matrix S(2) (n–2) 788 is a sub-matrix of the matrix S(n)(n) including only (2) rows (O and P) and (n–2) columns. It is constructed from the two rows (O and P) of the S(n)(n) matrix representing the electromagnetic coupling values of the series-shunt sampling sub-ports (O and P). Note that both of the two rows (O and P) exclude two elements located within the columns (O and P).

The multiplier matrix S(Q) 786, includes (2) rows and (2) columns and four elements. Each element is determined by dividing a numerator 792 value by a denominator 794 value. Using the mapping convention (X=O) and (Y=P), the denominator value equals a first product value minus a second product value.

The first product value of the denominator equals (1–S(O)(P)) multiplied by (1–S (P)(O)). The S(O)(P) value is the electromagnetic coupling value stored within the element located within the row associated with port (O) and the column associated with column (P) of the S(n)(n) matrix and is equal to a magnitude value of 0.01 and an angle value of –105. The S(P)(O) value is the electromagnetic coupling value stored within the element located within the row associated with port (P) and the column associated with column (O) of the S(n)(n) matrix and is also equal to a magnitude value of 0.01 and an angle value of –105.

The second product value of the denominator 794 equals S(O)(O) multiplied by S (P)(P). The S(O)(O) value is the electromagnetic coupling value stored within the element located within the row associated with port (O) and the column associated with port (O), of the S(n)(n) matrix, which equals a magnitude value of 0.46 and an angle value of –112 degrees. The S(P)(P) value is the electromagnetic coupling value stored within the element located within the row associated with port (P) and the column associated with port (P) of S(n)(n), which equals a magnitude value of 0.21 and an angle value of 46 degrees.

The S(Q) [1][1] element, located within the first row and first column of the S(Q) multiplier matrix 786, is the value S(O)(O) divided by the above described denominator. The S(Q) [1][2] element, located within the first row and second column of the S(Q) multiplier matrix, is the value (1–S(P)(O)) divided by the above described denominator. The S(Q) [2][1] element, located within the second row and first column of the S(Q) multiplier matrix, is the value (1–S(O)(P)) divided by the above described denominator. The S(Q) [2][2] element, located within the second row and first column of the S(Q) multiplier matrix, is the value S(P)(P) divided by the above described denominator.

The S(reduced)(n–2)(n–2) matrix 780, is reduced with respect to the series-shunt sampling port (OP). To determine the matrix 780, the matrix S(2)(n–2) 788 is multiplied by the matrix S(Q) 786 to generate a first matrix product. The first matrix product is further multiplied by the matrix S(n–2)(2) 784 to generate a second matrix product. The second matrix product is added to the matrix S(un-reduced)(n–2)(n–2) 782 to generate the matrix S(reduced)(n–2)(n–2) 780. Because other series-shunt sampling ports, such as (EF), (GH), (IJ), (KL) and (MN) remain within the resulting S(reduced)(n–2)(n–2) matrix, the S(reduced)(n–2)(n–2) matrix is partially reduced.

FIG. 7D illustrates a fully reduced matrix resulting from the elimination of the effect of one or more sampling ports. The fully reduced matrix of FIG. 7D is transformed from the un-reduced matrix of FIG. 7A. The un-reduced matrix of FIG. 7A was transformed via the mathematical operations described in association with FIG. 7B. Notice that the fully reduced matrix of FIG. 7D includes only electromagnetic coupling values that are associated with the nominal ports of the circuit representation 100. These electromagnetic coupling values are free of the effects of any of the non-nominal ports, namely the series-shunt sampling ports (KL), (EF), (GH), (IJ), (MN) and (OP). This matrix stores the final results of an electromagnetic analysis of the circuit representation 100.

FIG. 8 illustrates a set of mathematical operations utilized for employing impedance (Z) parameters for electro-magnetic analysis and for eliminating the effect of adding one or more series gap ports, functioning as sampling ports, within one or more super-sections. In this embodiment, electromagnetic analysis of one or more super-sections is performed by determining impedance (Z) parameter couplings associated with and between a set of nominal ports, associated with and between a set of sampling ports and associated with and between the union of the set of nominal ports and the set of sampling ports while employing series gap ports functioning as sampling ports.

As shown by equation 810, determination of a Z-parameter coupling between two ports involves effecting a connection of a power supply to a second port, adjusting the voltage (V2) of the power supply so that 1.0 amps (I2) is supplied into the second port and simultaneously measuring the open circuit voltage (V1) at a first port while all ports placed into an open circuit state. Because of the open circuit at all ports, including the first port, there is no flow of current (I1) at the first port. If the first port and the second port are the same port, for example port 1, then the Z parameter impedance (Z11) is the voltage (V1) required to supply 1 amp to port 1 divided by the 1 amp of current (I1) supplied to port 1.

As shown in equation 810, the Z parameter coupling measuring the effect of supplying 1 amp at the second port (port 2) upon the first port (port 1) is represented by the symbol (Z12). Z12 is determined by dividing the open circuit voltage at port 1 (V1) by the current at port 2 (I2) while all ports are placed into an open circuit state. Notice that I1 equals 0 amps because of the open circuit at the first port (port 1).

Equation 820 represents that a matrix of voltage values (Vn) is equivalent to a matrix of Z parameter values (Zn) multiplied by a matrix of current values (In). The symbol (N) represents the number of nominal ports that are located within a portion of the circuit, namely the one or more super-sections that are being electro-magnetically analyzed. The voltage matrix (Vn) has a dimension of N rows and one column. The Z parameter matrix has a dimension of N rows and N columns. The current matrix has a dimension of N rows and one column.

As described in association with FIGS. 1A-2B, sampling ports are added to one or more super-sections to supplement the nominal ports that are located within the one or more super-sections. The symbol (S) represents the number of sampling ports added to the portion of the circuit, namely the one or more super-sections that are being electro-magnetically analyzed.

The voltage values (Vs) associated with the added sampling ports are appended to (combined with) the matrix of voltage values (Vn) for the nominal ports, forming a matrix represented by the symbol (Vn/Vs). The voltage matrix (Vs) has a dimension of S rows and 1 column. The combined voltage matrix (Vn/Vs) has a dimension of (N+S) rows and one column.

The matrix of current values (Is) for the added sampling ports is also appended to the matrix of current values (In) for the nominal ports, forming a matrix represented by the symbol (In/Is). The current matrix (In) has a dimension of N rows and one column. The current matrix (Is) has a dimension of S rows and one column. The current matrix (In/Is) has a dimension of (N+S) rows and one column.

A matrix of Z parameter values (Zn+s) includes Z parameter values associated with and between the original nominal ports, associated with and between the added sampling ports and associated with and between the original nominal ports and the added sampling ports.

Equation 830 represents that the matrix of nominal and sampling port voltage values (Vn+s), shown as (Vn/Vs) 832 is equivalent to the matrix of nominal and sampling port Z parameter values (Zn+s) 834 multiplied by the matrix of nominal and sampling port current values (In+s), shown as (In/Is) 836. The matrix of current values (In/Is) 836 is isolated on one side of this equation by multiplying both sides of this equation 830 by a matrix (Yn+s) 844, equal to an inversion of the matrix of Z parameter values (Zn+s) 834.

Equation 840 isolates the matrix of current values (In/Is) 842 (equivalent to 836) as described above onto the left side of the equation 840. As shown, the matrix of current values (In/Is) 842 (equivalent to 836) is equal to the matrix (Yn+s) 844 multiplied by the matrix of voltage values (Vn/Vs) 846 (equivalent to 832).

The matrix (Yn+s) 844, equal to an inversion of the matrix of Z parameter values (Zn+s) 834, and represents Y parameter coupling values associated with and between the nominal ports (N), associated with and between the added sampling ports (S) and associated with and between the nominal and sampling ports (N+S).

In this embodiment, the sampling ports are implemented as series gap ports. Each series gap port creates an open circuit. The isolating effect of a gap port is eliminated when the gap port is short circuited and the gap within the gap port is eliminated, rendering the voltage across the gap port to equal zero volts. Mathematically, setting the voltage value of each of the sampling ports, namely each of the elements of the (Vs) matrix, equal to zero volts, effectively short circuits each of the sampling ports.

The equation 850 represents the result of eliminating the effect of the sampling ports by setting the voltage value of each of the sampling ports, namely each of the elements of the (Vs) matrix within the equation 840, equal to a value of zero volts. As shown in equation 850, the matrix of current values (In) for the nominal ports is equivalent to a matrix of admittance values (Ynn) multiplied by the matrix of voltage values (Vn) for the nominal ports. Notice that (Ynn) is a subset of matrix elements of the matrix (Yn+s) 844 that represents coupling values associated with and between ports excluding sampling ports, namely the nominal ports.

The equation 860 represents that the matrix 862 of Z parameter values for the nominal ports is equal to an inversion 864 of the matrix of Y parameter values 844 of equation 850. Equation 860 is obtained by multiplying both sides of the equation 850 by the matrix 864 and dividing both sides of the equation 850 by the matrix of current values (In) 852 for the nominal ports. As a result, the matrix of Z parameter values for the nominal ports, represented by the symbol (Zn) 862 is isolated and shown equal to a matrix that is an inversion 864 of the sub-matrix 848 of the matrix 844 of Y parameter values of equation 850. The sub-matrix 864 is generated from inverting the sub-matrix 848 of the matrix 844. Note that the inversion of matrix 844 does not yield the inversion 864 of the sub-matrix 848.

To summarize, electromagnetic analysis of one or more super-sections is performed by determining impedance (Z) parameter couplings associated with and between a set of nominal ports, associated with and between a set of sampling ports and associated with and between the union of the set of nominal ports and the set of sampling ports while employing series gap ports functioning as sampling ports.

Referring to FIG. 4B, it illustrates a side perspective view of a gap isolation port 410. As shown, the gap isolation port 410 includes a small gap 412 in series with a conductor 414. The conductor 414 includes two conductor segments 414A, 414B. When used as an isolating port for a section or super-section, one conductor segment 414A is located within the perimeter of an isolated section or super-section while the other conductor segment 414B is located outside of the perimeter of the isolated section or super-section respectively. The gap 412 creates an open circuit to prevent current from flowing through and between both the conductors 414A, 414B and between the section or super-section and the portion of the electrical circuit located outside of the section or super-section, respectively. As shown, no conductive path exists between the conductor 414 to a ground potential 418.

The terminals 416A and 416B are each conductor segments and are conductively attached to conductor segments 414A and 416B, respectively. Placing a conductive path between conductor segment 414A and conductor segment 414B defeats the isolating function of the gap isolation port 410. To preserve isolation of a section or super-section, a power supply (source of voltage or current) should not be placed (in either direction) across the gap 412 of a gap isolation port 410.

For embodiments that use one or more gap isolation ports to provide electromagnetic isolation for a section or super-section, a power supply (source of voltage and current) should be applied at a port other than a gap isolation port to provide an electrical stimulus to a section or super-section. Doing otherwise would defeat the electromagnetic isolation of the section or super-section provided by the one or more gap isolation ports 410.

In some embodiments, an electromagnetic analysis method is performed using impedance (Z) parameters. Using this type of method, a current is supplied into a first port of interest and an open circuit voltage is measured at a second port of interest while the super-section is electromagnetically isolated from the remainder of the electrical circuit. In some circumstances, the first and second ports may be the same port.

When using this type of (Z parameter) electromagnetic analysis method, an isolation method incorporating one or more gap isolation ports can provide substantial isolation to a section or super-section, and is typically more effective than and preferred relative to an isolation method incorporating a shunt port. The shunt ports and the series-shunt ports require connection to ground, and thus also provide better isolation.

Preferably, the selection of a gap type of port as the type of port to be used within a super-section, prompts the selection and use of the gap port within other super-sections that are to be analyzed in combination with the super-section, so as to support a consistent and accurate electromagnetic analysis of the combined super-sections.

An isolation port is utilized to reduce electromagnetic coupling between opposite sides of a section or super-section perimeter line. Optionally, electromagnetic coupling can be further reduced by supplementing each gap isolation port with a lumped network. For example, a negative capacitance can be placed across a gap port (See FIG. 4B) to remove the effect of a positive fringing (field) capacitance that is likely to reside in proximity to the gap isolation port during an electromagnetic analysis. This type of option, also known as "de-embedding", or "calibration", can be performed using standard circuit theory techniques.

Optionally, a shunt admittance can be applied to supplement each gap port to reduce any electric current electromagnetically coupled across the gap port while the gap port is open circuited. This modifies the sampled complete structure Z-matrix and increases the accuracy of the final analysis by reducing coupling across section and super-section boundaries.

In another type of embodiment, electromagnetic analysis of one or more super-sections can be performed by determining admittance (Y) parameter couplings associated with and between a set of nominal ports, associated with and between a set of sampling ports and associated with and between a union of the set of nominal ports and the set of sampling ports, while employing shunt ports functioning sampling ports.

FIG. 9 illustrates a set of mathematical operations utilized for employing admittance (Y) parameters for electro-magnetic analysis and for eliminating the effect of adding one or more series shunt ports, functioning as sampling ports, within one or more super-sections. In this embodiment, electromagnetic analysis of one or more super-sections is performed by determining impedance (Y) parameter couplings associated with and between a set of nominal ports, associated with and between a set of sampling ports and associated with and between the union of the set of nominal ports and the set of sampling ports while employing series shunt ports functioning as sampling ports.

As shown by equation 910, determination of a Y-parameter coupling between two ports involves effecting a connection of a power supply to a second port, adjusting the voltage (V2) of the power supply so that 1.0 volt (V2) is supplied into the second port and simultaneously measuring the closed circuit current (I1) at a first port while all ports placed into an closed circuit state. Because of the closed circuit at all ports, including the first port, there is no voltage difference across the terminals of the first port. If the first port and the second port are the same port, for example port 1, then the Y parameter admittance (Y11) is the current (I1) flowing at port 1 divided by the 1 volt of voltage supplied to port 1.

As shown in equation 910, the Y parameter coupling measuring the effect of supplying 1 volt at the second port (port 2) upon the current flowing across the terminals of the first port (port 1) is represented by the symbol (Y12). Y12 is determined by dividing the closed circuit current at port 1 (I1) by the voltage applied across the terminals of port 2 (V2) while all ports are placed into a closed circuit state. Notice that V1 equals 0 volts because of the closed circuit between the terminals of the first port (port 1).

Equation 920 represents that a matrix of current values (In) is equivalent to a matrix of Y parameter values (Yn) multiplied by a matrix of voltage values (Vn). The symbol (N) represents the number of nominal ports that are located within a portion of the circuit, namely the one or more super-sections that are being electro-magnetically analyzed. The current matrix (In) has a dimension of N rows and one column. The Y parameter matrix has a dimension of N rows and N columns. The voltage matrix (Vn) has a dimension of N rows and one column.

As described in association with FIGS. 1A-2B, sampling ports are added to one or more super-sections to supplement the nominal ports that are located within the one or more super-sections. The symbol (S) represents the number of sampling ports added to the portion of the circuit, namely the one or more super-sections that are being electro-magnetically analyzed.

The matrix of current values (Is) for the added sampling ports is also appended to the matrix of current values (In) for the nominal ports, forming a matrix represented by the symbol (In/Is). The current matrix (In) has a dimension of S rows and one column. The current matrix (Is) has a dimension of S rows and one column. The current matrix (In/Is) has a dimension of (N+S) rows and one column.

The voltage values (Vs) associated with the added sampling ports are appended to (combined with) the matrix of voltage values (Vn) for the nominal ports, forming a matrix represented by the symbol (Vn/vs). The voltage matrix (Vn) has a dimension of N rows and 1 column. The voltage matrix (Vs) has a dimension of S rows and 1 column. The combined voltage matrix (Vn/Vs) has a dimension of (N +S) rows and one column.

A matrix of Y parameter values (Yn+s) includes Y parameter values associated with and between the original nominal ports, associated with and between the added sampling ports and associated with and between the original nominal ports and the added sampling ports.

Equation 930 represents that the matrix of nominal and sampling port current values (In+s), shown as (In/Is) 932 is equivalent to the matrix of nominal and sampling port Y parameter values (Yn+s) 934 multiplied by the matrix of nominal and sampling port voltage values (Vn+s), shown as (Vn/Vs) 936. The matrix of current values (In/Is) 936 is isolated on one side of this equation by multiplying both sides of this equation 830 by a matrix (Zn+s) 944, equal to an inversion of the matrix of Y parameter values (Yn+s) 834.

Equation 940 isolates the matrix of voltage values (Vn/Vs) 942 as described above onto the left side of the equation 940. As shown, the matrix of voltage values (Vn/Vs) 942 (equivalent to 936) is equal to the matrix (Zn+s) 944 multiplied by the matrix of current values (In/Is) 946 (equivalent to 932).

The matrix (Zn+s) 944, equal to an inversion of the matrix of Y parameter values (Yn+s) 934, and represents Z parameter coupling values associated with and between the nominal ports (N), associated with and between the added sampling ports (S) and associated with and between the nominal and sampling ports (N+S).

In this embodiment, the sampling ports are implemented as shunt ports. Each shunt creates a closed circuit to ground. The isolating effect of a shunt port is eliminated when the shunt port is open circuited and a gap within the shunt to ground is formed, rendering the current across the shunt port to equal zero amps. Mathematically, setting the current value of each of the sampling ports, namely each of the elements of the (Is) matrix, equal to zero amps, effectively open circuits each of the sampling ports.

The equation 950 represents the result of eliminating the effect of the sampling ports by setting the current value of each of the sampling ports, namely each of the elements of the (Is) matrix within the equation 940, equal to a value of zero amps. As shown in equation 950, the matrix of voltage values (Vn) for the nominal ports is equivalent to a matrix of impedance values (Znn) multiplied by the matrix of current values (In) for the nominal ports. Notice that (Znn) is a subset of matrix elements of the matrix (Zn+s) 944 that represents coupling values associated with and between ports excluding sampling ports, namely the nominal ports.

The equation 960 represents that the matrix 962 of Y parameter values for the nominal ports is equal to an inversion 964 of the matrix of Z parameter values 944 of equation 950. Equation 960 is obtained by multiplying both sides of the equation 950 by the matrix 964 and dividing both sides of the equation 950 by the matrix of voltage values (Vnn) 952 for the nominal ports. As a result, the matrix of Y parameter values for the nominal ports, represented by the symbol (Yn) 962 is isolated and shown equal to a matrix that is an inversion 964 of the sub-matrix 948 of the matrix 944 of Z parameter values of equation 950. The sub-matrix 964 is generated from inverting the sub-matrix 948 of the matrix 944. Note that the inversion of matrix 944 does not yield the inversion 964 of the sub-matrix 948.

To summarize, electromagnetic analysis of one or more super-sections is performed by determining impedance (Z) parameter couplings associated with and between a set of nominal ports, associated with and between a set of sampling ports and associated with and between the union of the set of nominal ports and the set of sampling ports while employing series gap ports functioning as sampling ports.

FIG. 4C illustrates a side perspective view of a shunt isolation port 420. As shown, the shunt isolation port 420 is a shunt 426 (conductive pathway) electrically connecting a conductor 424 to a ground potential 428. The perimeter of a section or super-section intersects the conductor 424 at location 422 along the conductor 424. The shunt 426 directs current traveling through the conductor 424 at location 422 to a ground potential 428 in order to prevent any substantial current from flowing between the section or super-section and the remainder of the electrical circuit located outside of the section or super-section.

The shunt 426 includes a first terminal 426A and a second terminal 426B and a middle conductor segment 426C. The first terminal 426A is physically and electrically connected to the conductor 424 and the conductor segment 426C. The second terminal 426B is physically and electrically connected to the ground potential 428 and the conductor segment 426C. Removing the conductor segment 426C from the shunt 426 creates a open circuit between the conductor 424 and the ground potential 428 and defeats the isolating function of the shunt isolation port 420.

For embodiments that use one or more shunt isolation ports to provide electromagnetic isolation for a section or super-section, a power supply (source of voltage and current) should be applied at a port other than a shunt isolation port to provide an electrical stimulus to a section or super-section. Doing otherwise could defeat the electromagnetic isolation of the section or super-section provided by the one or more shunt isolation ports 420.

In some embodiments, an electromagnetic analysis method is performed using admittance (Y) parameters. Using this type of (Y parameter) method, a voltage is supplied into a first port of interest and all other ports are shorted to ground. The current is measured at a second port of interest while a super-section is isolated from the remainder of the electrical circuit. In some circumstances, the first and second ports may be the same port. In this circumstance, all ports except the source port are shorted to ground. As a result, the second port is not shorted to ground when the first and second ports are the same port.

When using this type of (Y parameter) electromagnetic analysis method, an isolation method incorporating one or more shunt isolation ports can provide substantial isolation to a section or super-section, and is typically more effective than and preferred relative to an isolation method incorporating a gap port.

Preferably, the selection of a shunt type of port as the type of port to be used within a super-suction, prompts the selection and use of a shunt port to implement other ports within the same super-section and to implement ports within other super-sections that are to be analyzed in combination with the super-section, so as to support a consistent and accurate electro-magnetic analysis of the combined super-sections.

A shunt isolation port is required to connect to a consistent ground 428 to achieve substantial isolation. Hence, a consistent ground potential exists at ground 428 to which all shunt isolation ports residing within a super-section are connected. Preferably, the consistent ground potential is also a global (perfect) ground potential.

An isolation port is utilized to reduce electromagnetic coupling between opposite sides of a section or super-section perimeter line. Optionally, electromagnetic coupling can be further reduced by supplementing each shunt isolation port with a negative inductance. This can be utilized to counteract (cancel) the impedance (usually inductive) of the shunt port and create a more perfect short to ground in order to increase electromagnetic isolation.

FIG. 10A illustrates a definition of a matrix like arrangement of (9) distinct and non-overlapping super-sections. The super-sections are arranged into 3 rows and 3 columns within a two dimensional planar circuit. As shown, from left to right, the upper row includes super-sections AA, AB and AC, the middle row includes super-sections BA, BB and BC and the lower row includes super-sections CA, CB and CC respectively. Each super-section is shown to abut at least 3 other super-sections. The super-section (BB) is the centermost super-section of this arrangement and is shown to abut each of the (8) other super-sections AA, AB, AC, BA, BC, CC, CB and CA.

With respect to this type of embodiment, the electromagnetic analysis of each super-section determines an electromagnetic coupling value associated with and between ports that are located within each same one super-section. In this type of embodiment, there are no circuit location or ports, that are located outside of a perimeter of a super-section, that can be located in more than one super-section.

Intra super-section electromagnetic coupling between ports that are located within the same super-section can be accurately determined as a result of an electro-magnetic analysis of the same super-section. Inter super-section electromagnetic coupling between ports that are located within different and non-overlapping super-sections cannot be accurately determined as a result of an electro-magnetic analysis of the individual and non-overlapping super-sections. As a result, the range of continuity of electromagnetic analysis for a port that is located within a super-section extends to (but not beyond) the perimeter of the super-section within which the port is located.

Indirect electromagnetic coupling is coupling between ports due to the interaction of electromagnetic fields. This is sometimes also called 'stray coupling'. Direct electromagnetic coupling is coupling due to the flow of electric current through conductors. Many ports in an electrical circuit experience indirect electromagnetic coupling, although some ports experience it in an extremely small amount. Direct electromagnetic coupling is typically experienced only between ports that have a conductive electrical connection between them. The total electromagnetic coupling between two ports is the sum of the indirect and direct electromagnetic coupling.

FIG. 10B illustrates the (9) super-sections of FIG. 10A that are each re-defined to overlap at least one other super-section along a direction of a horizontal (X) axis. As shown, the super-sections AA and AB overlap each other and super-sections AB and AC over lap each other. The super-sections BA and BB overlap each other and super-sections BB and BC over lap each other. The super-sections CA and CB overlap each other and super-sections CB and CC over lap each other. Each super-section is re-defined via expansion along its horizontal (X) dimension to accommodate the overlapping shown in FIG. 10B. The vertical portions of the perimeters of super-sections AB, BB and CB are shown as dashed lines to distinguish overlapping perimeter portions of those super-sections.

As shown, a port 1020a is located only in super-section AA, a port 1020b is located in an overlapping portion of both super-section AA and AB, a port 1020c is located in an overlapping portion of both super-section AB and AC and a port 1020d is located only in super-section AC.

Intra super-section electro-magnetic coupling between ports that are located within the same super-section can be accurately determined as a result of an electromagnetic analysis of the same super-section. For example, intra super-section electro-magnetic coupling can be determined between port 1020a and port 1020b (super-section AA), between port 1020b and port 1020c (super-section AB) and between port 1020c and port 1020d (super-section AC).In accordance with the invention, inter super-section electromagnetic coupling can be determined between ports that are located within distinct but overlapping super-sections. Inter super-section electro-magnetic coupling can be accurately determined between port 1020a (super-section AA only), and port 1020c (super-sections AB and AC only), between port 1020a (super-section AA only), and 1020d (super-section AC only), between port 1020b (super-section AA and AB only), and 1020d (super-section AC only). As a result, the range of continuity of analysis for a port that is located within a super-section, such as port 1020a, can extend beyond the perimeter of the super-section (AA) within which the port 1020a resides.

Indirect (stray) EM coupling that may exist between two ports, such as between port 1020a and port 1020c, is not specifically determined by the preferred method of the invention. Instead, the preferred method of the invention specifically determines stray coupling that may exist between port 1020a and port 1020b (super-section AA), and between port 1020b to 1020c (super-section AB). Ports 1020a and 1020b are closer to each other, and ports 1020b and 1020c are closer to each other, relative to the proximity of ports 1020a and 1020c to each other. As a result, a more significant amount of EM stray coupling typically occurs between 1010a and 1020b and between 1020b and 1020c than the EM stray coupling that would typically occur between ports 1020a and port 1020c. The accuracy of an EM coupling determination between ports 1020a and 1020c can be evaluated, influenced and refined by varying the definition of super-sections including ports 1020a and/or 1020c.

Figure 10C:
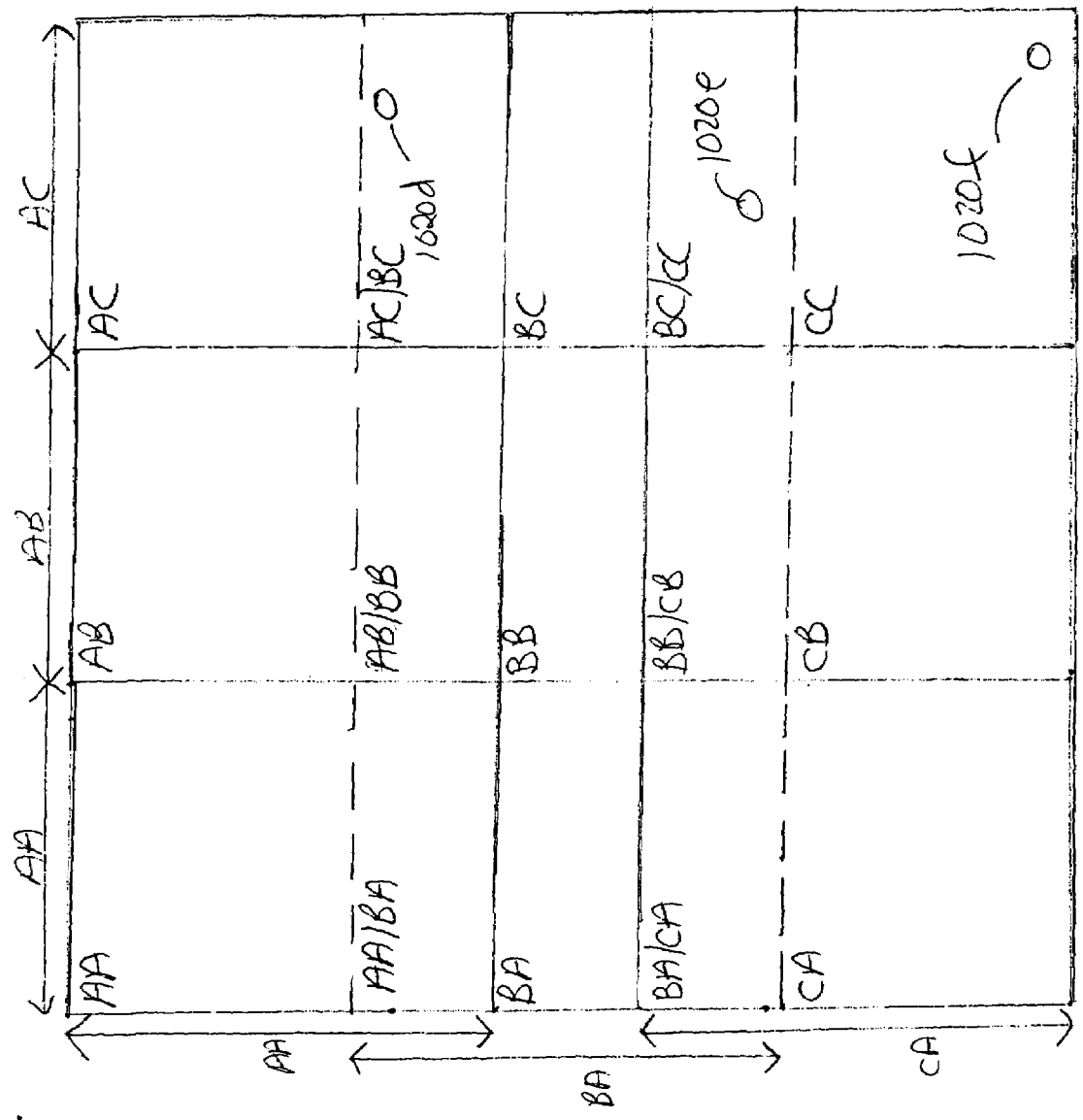
FIG. 10C illustrates the (9) super-sections of FIG. 10A that are re-arranged to uniformly overlap each other along a direction of a vertical Y axis.

FIG. 10C illustrates the (9) super-sections of FIG. 10A that are each re-defined to overlap at least one other super-section along a direction of a vertical (Y) axis. As shown, the super-sections AA and BA overlap each other and super-sections BA and CA over lap each other. The super-sections AB and BB overlap each other and super-sections BB and CB over lap each other. The super-sections AC and BC overlap each other and super-sections BC and CC over lap each other. Each super-section is re-defined via expansion along its vertical (Y) dimension to accommodate the overlapping shown in FIG. 10C. The horizontal portions of the perimeters of super-sections BA, BB and BC are shown as dashed lines to distinguish overlapping perimeter portions of those super-sections.

Inter super-section electro-magnetic coupling (with respect the super-section definitions of FIGS. 10A-10B) can be determined between port 1020d (super-section AC and BC only (FIG. 10C)), and port 1020e (super-section BC and CC only (FIG. 10C)), between port 1020d (super-section AC and BC only (FIG. 10C)) and port 1020f (super-section CC only). As a result, the range of continuity of analysis for a port that is located within a super-section, such as port 1020d, can extend beyond the perimeter of the super-section (AC) (FIGS. 10A-10B) within which the port 1020d originally resided as shown in FIGS 10A-10B.

Figure 10D:
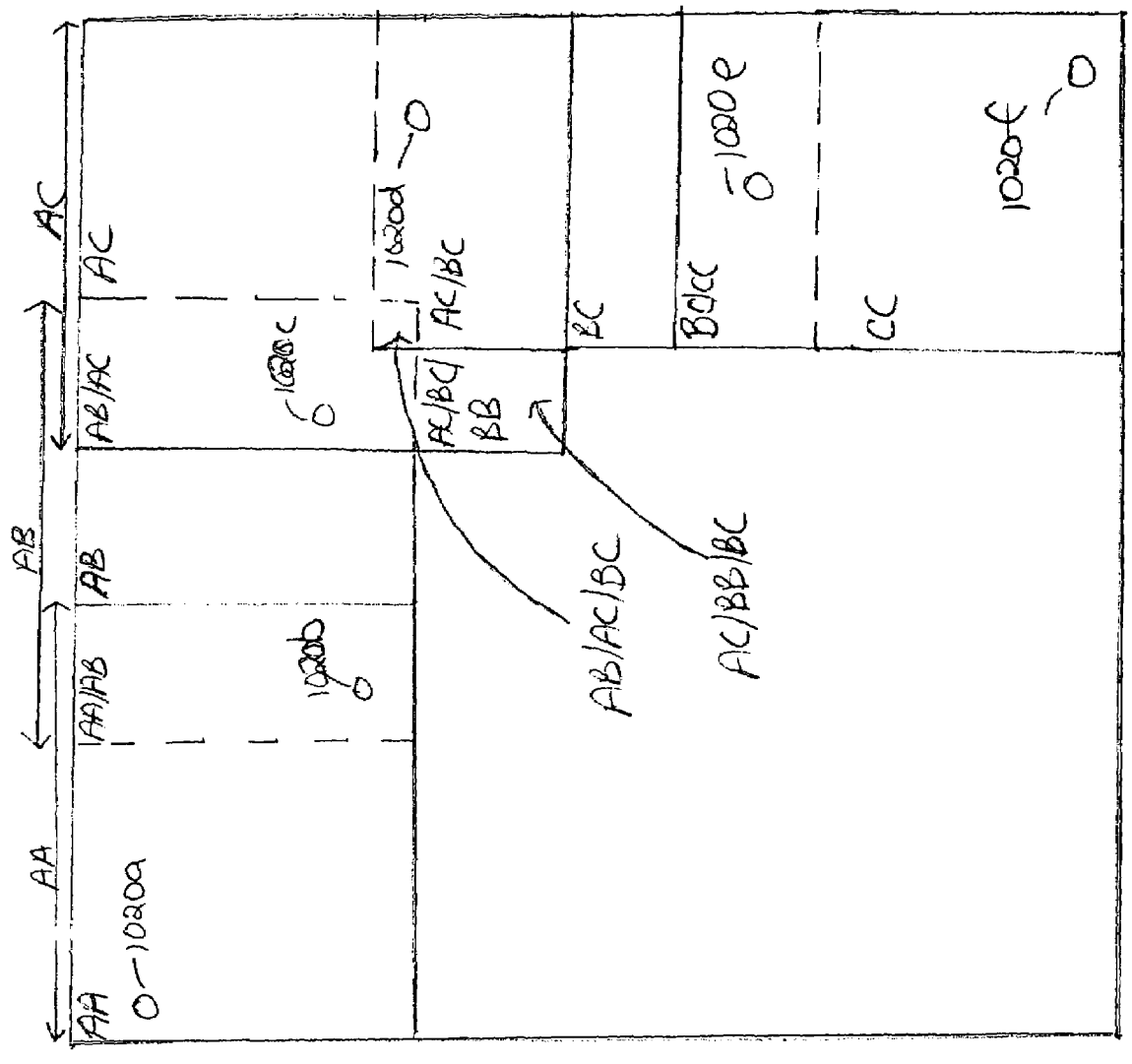
FIG. 10D illustrates the (9) super-sections of FIG. 10A that are re-arranged to uniformly overlap each other both along the direction of the horizontal X axis and along the direction of the vertical Y axis.

FIG. 10D illustrates (5) of the (9) super-sections of FIG. 10A that are each re-defined to overlap at least one other super-section along a path of overlapping super-sections that includes the AA, AB, AC, BC and CC super-sections. Like shown in FIG. 10B, the super-sections AA, AB and AC overlap along the path in the direction of the horizontal X axis. Like shown in FIG. 10C, the super-sections AC, BC and CC overlap along the path in the direction of the vertical Y axis. The vertical portions of the perimeter of super-section AB and the horizontal portions of the perimeter of super-section BC are shown as dashed lines to distinguish overlapping perimeter portions of those super-sections.

Unlike FIGS. 10B and 10C, super-section AC is redefined and expanded in both the horizontal (X) and vertical (Y) directions to overlap both the AB and BC super-sections. Like described in association with FIGS. 10B and 10C, inter super-section electro-magnetic coupling can be determined between ports 1020a (super-section AA only) and 1020d (super-section AC and BC only) via horizontal overlapping of the super sections AA, AB and AC and between ports 1020d (super-sections AC and BC only) and port 1020f (super-section CC only) via vertical overlapping of the super-sections AC, BC and CC.

In accordance with the invention, by overlapping super-sections in both the horizontal and vertical directions, the determination of inter super-section coupling can be extended in both the horizontal and vertical directions from port 1020a (super-section AA only) all the way to 1020f (super-section CC only). As a result, the range of continuity of electro-magnetic analysis for a port that is located within a super-section, such as port 1020a (super-section AA only), can extend far beyond the perimeter of the super-section (AA) within which the port 1020a exclusively resides.

In accordance with the invention, by overlapping super-sections in both the horizontal and vertical directions, the determination of inter super-section coupling can be extended in both the horizontal and vertical directions from port 1020a (super-section AA only) all the way to 1020f (super-section CC only). As a result, the range of continuity of electromagnetic analysis for a port that is located within a super-section, such as port 1020a (super-section AA only), can extend far beyond the perimeter of the super-section (AA) within which the port 1020a exclusively resides.

Importantly, electromagnetic coupling can be determined between ports, such as ports 1020a and 1020f, that are located far from each other within an electrical circuit without requiring the performance of an electromagnetic analysis of a large portion of the electrical circuit that includes both ports. As a result, the computational cost to perform electromagnetic analysis of a portion of a electrical circuit can grow linearly as a function of the size of the portion of the electrical circuit under electromagnetic analysis.

Also note that the accuracy and/or consistency of an electromagnetic analysis can be tested by expanding the size of (re-defining) super-sections used during each electromagnetic analysis of a super-section. In theory, results may be more accurate, even by a small amount, as super-sections are expanded. For a particular analysis, substantial differences in the results after expanding the size of (re-defining) super-sections and re-performing a particular electromagnetic analysis is a motivation for one to use larger super-sections for that particular analysis.

The S-parameter data of FIGS. 6A through 7D is expressed in units of decibels. Note that some of the simulation parameters used to generate the S-parameter values of FIGS. 6A through 7D are summarized as follows: Circuit geometry (all dimensions are mm): Substrate area: 14.0×14.0. Substrate thickness: 0.381; Substrate dielectric constant: 2.2; Cell size (used to subsection the circuit): 0.1×0.1; Resonator line width: 0.6; Long resonator line length (112, 116): 6.0; Short resonator line length (114A, 114B): 2.5; Analysis frequency for data in this table: 10 GHz.

While the present invention has been particularly shown and described with reference to the preferred mode as illustrated in the drawing, it will be understood by one skilled in the art that various changes in detail may be effected therein without departing from the spirit and scope of the invention as defined by the claims.

I claim:

1. An apparatus for performing an electromagnetic analysis of an electrical circuit structure, comprising:
   at least one software module; configured for
   inputting a representation of an electrical circuit structure; and for defining at least a pair of distinct super-sections within said electrical circuit structure, each one of said distinct super-sections having a perimeter, said distinct super-sections include a first super-section and a second super-section that each include a first common location that is located within both said first super-section and said second super-section, and where
   said first super-section includes a first common port that is located at said first common location and includes a first uncommon port that is located at a first uncommon location, said first uncommon location is not located within said second super-section, and where
   said second super-section includes a second common port that is located at said first common location and includes a second uncommon port that is located at a second uncommon location, said second uncommon location is not located within said first super-section;
   and said software module configured for determining an electro-magnetic coupling between said first port by performing actions including a first electro-magnetic analysis of said first super-section, by performing a second electro-magnetic analysis of said second super-section and by combining the results of said first electro-magnetic analysis and said second electro-magnetic analysis to yield a combined result.

2. The apparatus of claim 1 where said software module is further configured for providing an at least one electrical connection from said first common port and/or from said second common port to one consistent and pre-determined ground potential that is not otherwise provided to said first common port and/or said second common port.

3. The apparatus of claim 1 where said first common port and/or said second common port is a perimeter port.

4. The apparatus of claim 1 where said first common port and/or said second common port is an interior port.

5. The apparatus of claim 1 where said first common port and/or said second common port is a sampling port.

6. The apparatus of claim 1 where said first common port and/or said second common port is a nominal port.

7. The apparatus of claim 1 where said electro-magnetic coupling is determined in terms of scattering (S) parameters.

8. The apparatus of claim 1 where said electro-magnetic coupling is determined in terms of admittance (Y) parameters.

9. The apparatus of claim 1 where said electro-magnetic coupling is determined in terms of impedance (Z) parameters.

10. The apparatus of claim 1 where determining said electro-magnetic coupling between said first uncommon port and said second uncommon port includes simulating the electro-magnetic behavior of at least one of said super-sections by applying an electrical stimulus to said one of said super-sections while electro-magnetically isolating said one of said super-sections.

11. The apparatus of claim 1 that is configured to determine an electromagnetic coupling between two ports that are located within a same one of said super-sections by ignoring electromagnetic coupling associated with any port residing outside of said same one of said super-sections.

12. The apparatus of claim 1 where said combined result includes at least some selected electromagnetic effects that are associated with at least one selected port, and where said software module is configured to at least partially eliminate information associated with said selected electromagnetic effects from said combined result.

13. The apparatus of claim 2 where said software module is configured to represent said combined result in a matrix form and configured to at least partially eliminate information associated with said selected electromagnetic effects from said combined result by reducing said matrix with respect to said at least selected one port.

14. A method for performing an electromagnetic analysis of an electrical circuit structure, comprising the steps of:
obtaining a representation of an electrical circuit structure;
defining at least a pair of distinct super-sections within said electrical circuit structure, each one of said distinct super-sections having a perimeter, said distinct super-sections including a first super-section and a second super-section that each include a first common location that is located within both said first super-section and said second super-section, and where
said first super-section includes a first common port that is located at said first common location and includes a first uncommon port that is located at a first uncommon location, said first uncommon location is not located within said second super-section, and where
said second super-section includes a second common port that is located at said first common location and includes a second uncommon port that is located at a second uncommon location, said second uncommon location is not located within said first super-section; and
determining an electro-magnetic coupling between said first uncommon port and said second uncommon port by performing actions including a first electro-magnetic analysis of said first super-section, a second electro-magnetic analysis of said second super-section and combining the results of said first electro-magnetic analysis and said second electro-magnetic analysis to yield a combined result.

15. The method of claim 14 including a step of providing at least one electrical connection from said first common port and/or from said second common port to one consistent and pre-determined ground potential that is not otherwise provided to said first common port and/or said second common port.

16. The method of claim 14 where said electro-magnetic coupling is determined in terms of scattering (S) parameters.

17. The method of claim 14 where said electro-magnetic coupling is determined in terms of admittance (Y) parameters.

18. The method of claim 14 where said electro-magnetic coupling is determined in terms of impedance (Z) parameters.

19. The method of claim 14 where said combined result includes at least some selected electromagnetic effects that are associated with at least one selected port, and where said method includes a step where information associated with said selected electromagnetic effects is least partially eliminated from said combined result.

20. The method of claim 19 including a step of representing said combined result in a matrix form and including a step of at least partially eliminating information associated with said selected electromagnetic effects from said combined result by reducing said matrix with respect to said at least one selected port.

21. The method of claim 14 where determining said electro-magnetic coupling between said first uncommon port and said second uncommon port includes a step of simulating the electro-magnetic behavior of at least one of said super-sections by applying an electrical stimulus to said one of said super-sections while electro-magnetically isolating said one of said super-sections.

22. The method of claim 14 where determining an electromagnetic coupling between two ports that are located within a same one of said super-sections includes a step of ignoring electromagnetic coupling associated with any port residing outside of said same one of said super-sections.

23. An apparatus for performing an electromagnetic analysis of an electrical circuit structure, comprising:
at least one software module configured for:
inputting a representation of an electrical circuit structure; and for defining at least a pair of distinct super-sections within said electrical circuit structure, each one of said distinct super-sections having a perimeter, said distinct super-sections include a first super-section and a second super-section that each include a first common location that is located within both said first super-section and said second super-section, and where
said first super-section includes a first common port that is located at said first common location and includes a first uncommon port that is located at a first uncommon location, said first uncommon location is not located within said second super-section, and where
said second super-section includes a second common port that is located at said first common location and includes a second uncommon port that is located at a second uncommon location, said second uncommon location is not located within said first super-section;
and said software module is configured for determining an electro-magnetic coupling between said first uncommon port and said second uncommon port by performing actions simulating the electro-magnetic behavior of each said super-section by simulating an application of an electrical stimulus to each said super-section while simulating an electro-magnetic isolation of each said super-section from a remaining portion of said electronic circuit structure; and where said electro-magnetic isolation includes simulating the insertion of ports configured for performing electromagnetic isolation along said perimeter of each said super-section.

24. A method for performing an electromagnetic analysis of an electrical circuit structure, comprising the steps of:

obtaining a representation of an electrical circuit structure;

defining at least a pair of distinct super-sections within said electrical circuit structure, each one of said distinct super-sections having a perimeter, said distinct super-sections including a first super-section and a second super-section that each include a first common location that is located within both said first super-section and said second super-section, and where said first super-section includes a first common port that is located at said first common location and includes a first uncommon port that is located at a first uncommon location, said first uncommon location is not located within said second super-section, and where said second super-section includes a second common port that is located at said first common location and includes a second uncommon port that is located at a second uncommon location, said second uncommon location is not located within said first super-section; and determining an electro-magnetic coupling between said first uncommon port and said second uncommon port by performing actions simulating the electro-magnetic behavior of each said super-section by simulating an application of an electrical stimulus to each said super-section while simulating an electro-magnetic isolation of each said super-section from a remaining portion of said electronic circuit structure; and where said electro-magnetic isolation includes simulating the insertion of ports configured for performing electromagnetic isolation along said perimeter of each said super-section.

* * * * *

UNITED STATES PATENT AND TRADEMARK OFFICE
CERTIFICATE OF CORRECTION

PATENT NO. : 7,356,791 B2
APPLICATION NO. : 11/171935
DATED : April 8, 2008
INVENTOR(S) : James C. Rautio It is certified that error appears in the above-identified patent and that said Letters Patent is hereby corrected as shown below:

Claim 13, line 35 Col. 37, should be dependent on claim 12. Within the text of claim 13, please replace "claim 2" with --claim 12--.

Signed and Sealed this

Fifteenth Day of July, 2008

JON W. DUDAS
*Director of the United States Patent and Trademark Office*